(12) United States Patent
Nagatani et al.

(10) Patent No.: US 8,787,487 B2
(45) Date of Patent: Jul. 22, 2014

(54) DISTORTION COMPENSATION DEVICE AND DISTORTION COMPENSATING METHOD

(75) Inventors: Kazuo Nagatani, Yokohama (JP); Hiroyoshi Ishikawa, Yokohama (JP); Nobukazu Fudaba, Yokohama (JP); Yuichi Utsunomiya, Yokosuka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/461,928

(22) Filed: May 2, 2012

(65) Prior Publication Data

US 2012/0288030 A1 Nov. 15, 2012

(30) Foreign Application Priority Data

May 10, 2011 (JP) .................................. 2011-105430

(51) Int. Cl.
*H04L 27/10* (2006.01)
*H04J 3/16* (2006.01)
*G01V 3/38* (2006.01)
*H04L 25/49* (2006.01)

(52) U.S. Cl.
CPC ..................................... *H04L 25/49* (2013.01)
USPC ................................ 375/272; 370/468; 702/9

(58) Field of Classification Search
CPC ...................... H04L 27/3405; H04L 25/03885; H04L 1/24; H04L 27/367; H04L 1/0026; H04L 1/02; H04L 1/248; H04L 7/042
USPC .......................................... 375/222; 370/468
See application file for complete search history.

(56) References Cited

U.S. PATENT DOCUMENTS

| | | | | |
|---|---|---|---|---|
| 5,818,582 A * | 10/1998 | Fernandez et al. | ............ | 356/318 |
| 5,838,272 A * | 11/1998 | Steiner et al. | ................. | 341/143 |
| 5,870,668 A * | 2/1999 | Takano et al. | ................. | 455/126 |
| 6,191,648 B1 * | 2/2001 | Lewicki | ........................ | 327/554 |
| 6,421,355 B1 * | 7/2002 | Quiring et al. | ................. | 370/468 |
| 6,490,527 B1 * | 12/2002 | Utt | ..................................... | 702/9 |
| 2002/0064220 A1 * | 5/2002 | Yamano et al. | ............... | 375/222 |
| 2002/0080728 A1 * | 6/2002 | Sugar et al. | .................... | 370/252 |
| 2002/0095272 A1 * | 7/2002 | DiTommaso et al. | ......... | 702/189 |
| 2003/0095592 A1 * | 5/2003 | Bergmans et al. | ............. | 375/232 |
| 2006/0276146 A1 | 12/2006 | Suzuki et al. | | |
| 2008/0074186 A1 * | 3/2008 | Sihlbom et al. | ............... | 330/149 |

FOREIGN PATENT DOCUMENTS

| | | |
|---|---|---|
| JP | 9-69733 | 3/1997 |
| JP | 2007-13947 | 1/2007 |
| JP | 2008-514052 | 5/2008 |

* cited by examiner

*Primary Examiner* — Leon-Viet Nguyen
*Assistant Examiner* — Sarah Hassan
(74) *Attorney, Agent, or Firm* — Staas & Halsey LLP

(57) ABSTRACT

A distortion compensation device which reduces a distortion of an amplifier which is added to an output signal of the amplifier, the distortion compensation device including: a plurality of distortion compensation coefficient storage circuits which stores a plurality of distortion compensation coefficients and outputs the distortion compensation coefficients according to an amplitude of an input signal of the amplifier, a distortion compensating processing circuit which adds the distortion compensation coefficient output from each of the plurality of distortion compensation coefficient storage circuits to the input signal of the amplifier, and a distortion compensation coefficient updating circuit which performs weighting processing on the distortion compensation coefficient output from each of the plurality of distortion compensation coefficient storage circuits to reduce the distortion compensation coefficient and which calculates an update value of the distortion compensation coefficient by using the distortion compensation coefficient which is subjected to the weighting processing.

14 Claims, 15 Drawing Sheets

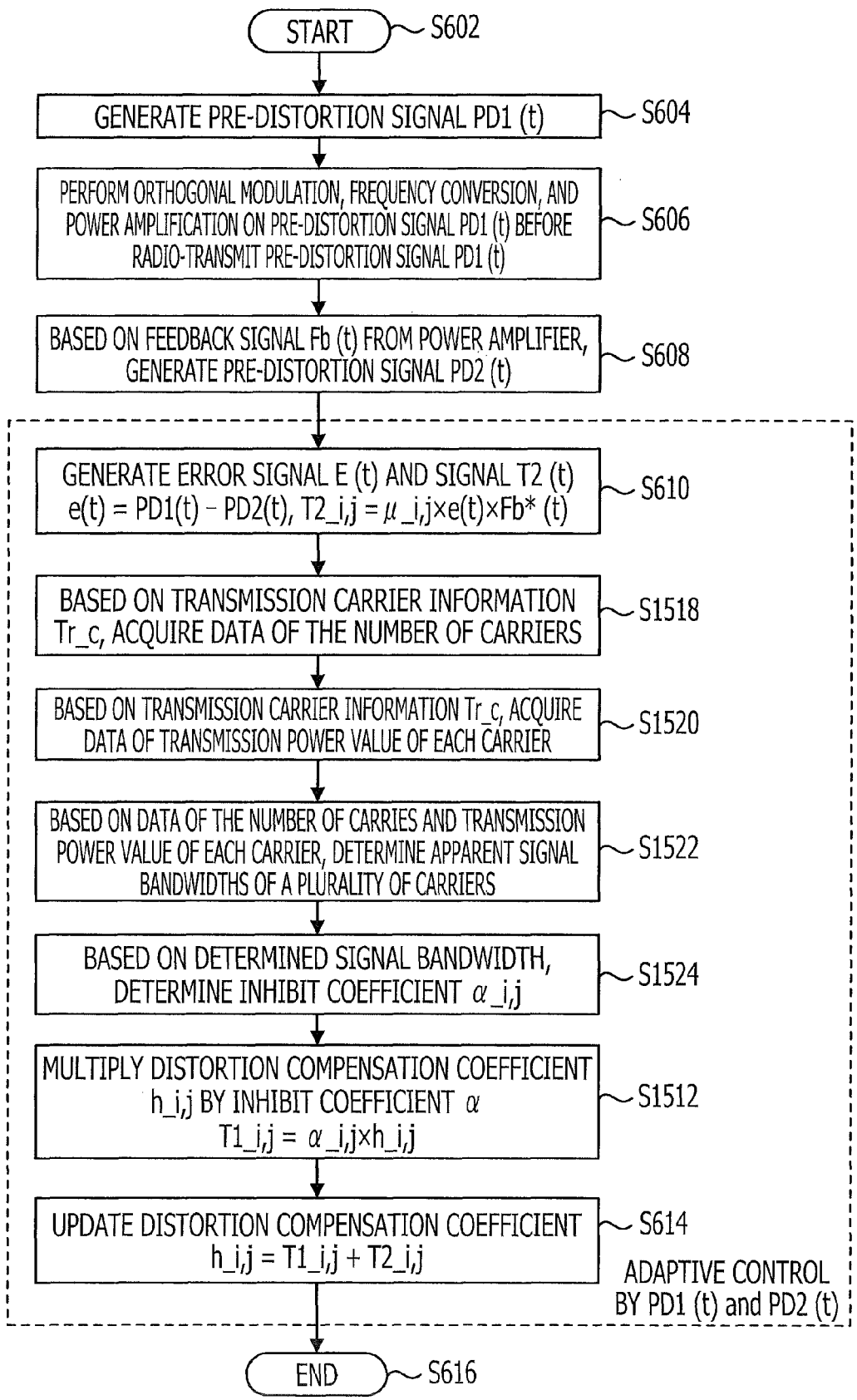

DISTORTION COMPENSATION DEVICE AND DISTORTION COMPENSATING METHOD

CROSS-REFERENCE TO RELATED APPLICATIONS

This application is based upon and claims the benefit of priority from the prior Japanese Patent Application No. 2011-105430 filed on May 10, 2011, the entire contents of which are incorporated herein by reference.

FIELD

The embodiments discussed herein are related to a distortion compensation device and a distortion compensating method.

BACKGROUND

A radio communication device in a radio communication system has been desired to be highly efficient from a view point of size reduction and power saving of the device.

A power amplifier included in the radio communication device is used in a saturation region where the efficiency of the device is generally high. However, a nonlinear distortion is increased if the power amplifier is used near the saturation region. Distortion compensating processing has been known as a technique for suppressing the nonlinear distortion and reducing an Adjacent Channel Power (ACP). A Feed Forward Amplifier (FF amplifier) that compensates a distortion of a main amplifier by a sub-amplifier, a Cartesian method for compensating the distortion by feeding back an amplifier output, and a Pre-distortion method for compensating the distortion by inputting an inverse distortion characteristic signal of the amplifier into the amplifier are examples of the distortion compensating processing. Regarding the Pre-distortion method, a digital pre-distortion method with a feedback loop that uses a series or a Look Up Table (hereinafter referred to as LUT) has been known. According to the pre-distortion method using the LUT, the distortion compensation coefficient used for the distortion compensating processing is stored in the LUT, and the distortion compensation coefficient is updated based on a transmission signal and a feedback signal.

On the other hand, in the power amplifier, a phenomenon called a memory effect is generated. The memory effect is a phenomenon in which an output signal corresponding to an input signal at a time is influenced by a past input signal. Therefore, the distortion compensation device is desired to compensate a nonlinear distortion in the above-described power amplifier and to compensate the influence of the memory effect in the power amplifier.

Patent Document 1 discloses a pre-distorter that includes a plurality of LUTs corresponding to a plurality of bands and uses a forgetting coefficient to update the distortion compensation coefficient. Patent Document 2 discloses an amplifier that compensates a distortion by using a forgetting coefficient to update the distortion compensation coefficient. Patent Document 3 discloses a pre-distortion device that includes a plurality of LUTs and performs distortion compensation by synthesizing the distortion compensation coefficient output from the plurality of LUTs.

Patent Document

[Patent Document 1] Japanese Laid-open Patent Publication No. 2007-013947

[Patent Document 2] Japanese Laid-open Patent Publication No. 09-069733

[Patent Document 3] Japanese National Publication of International Patent Application No. 2008-514052

SUMMARY

According to an aspect of the invention, a distortion compensation device which reduces a distortion of an amplifier which is added to an output signal of the amplifier, the distortion compensation device including: a plurality of distortion compensation coefficient storage circuits which stores a plurality of distortion compensation coefficients and outputs the distortion compensation coefficients according to an amplitude of an input signal of the amplifier, a distortion compensating processing circuit which adds the distortion compensation coefficient output from each of the plurality of distortion compensation coefficient storage circuits to the input signal of the amplifier, and a distortion compensation coefficient updating circuit which performs weighting processing on the distortion compensation coefficient output from each of the plurality of distortion compensation coefficient storage circuits to reduce the distortion compensation coefficient and which calculates an update value of the distortion compensation coefficient by using the distortion compensation coefficient which is subjected to the weighting processing.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 15 is a diagram illustrating an example of a flowchart of the updating processing of the distortion compensation coefficient in a distortion compensation device 1302.

DESCRIPTION OF EMBODIMENTS

According to the pre-distortion method using the LUT, amplitude (absolute value) of an updated distortion compensation coefficient may be excessively increased under a certain condition. This causes a problem that a distortion compensation characteristic deteriorates.

An aspect of the present invention is to prevent the amplitude (absolute value) of a distortion compensation coefficient from excessively increasing even if the update of the distortion compensation coefficient proceeds in a distortion compensation device.

The embodiments of the present invention will be described below.

Embodiment

Reference examples of the present invention will be described before the embodiments of the present invention.

Reference Example

There is a plural LUT-type distortion compensation device as a distortion compensation device that may suppress an increase of a circuit scale and compensate a distortion caused by a memory effect in addition to a non-linear distortion in a power amplifier. The plural LUT-type distortion compensation device has a plurality of LUTs and generates pre-distortion signals by performing the distortion compensating processing based on a plurality of distortion compensation coefficients and transmission signals stored in the plurality of LUTs.

Figure 1:
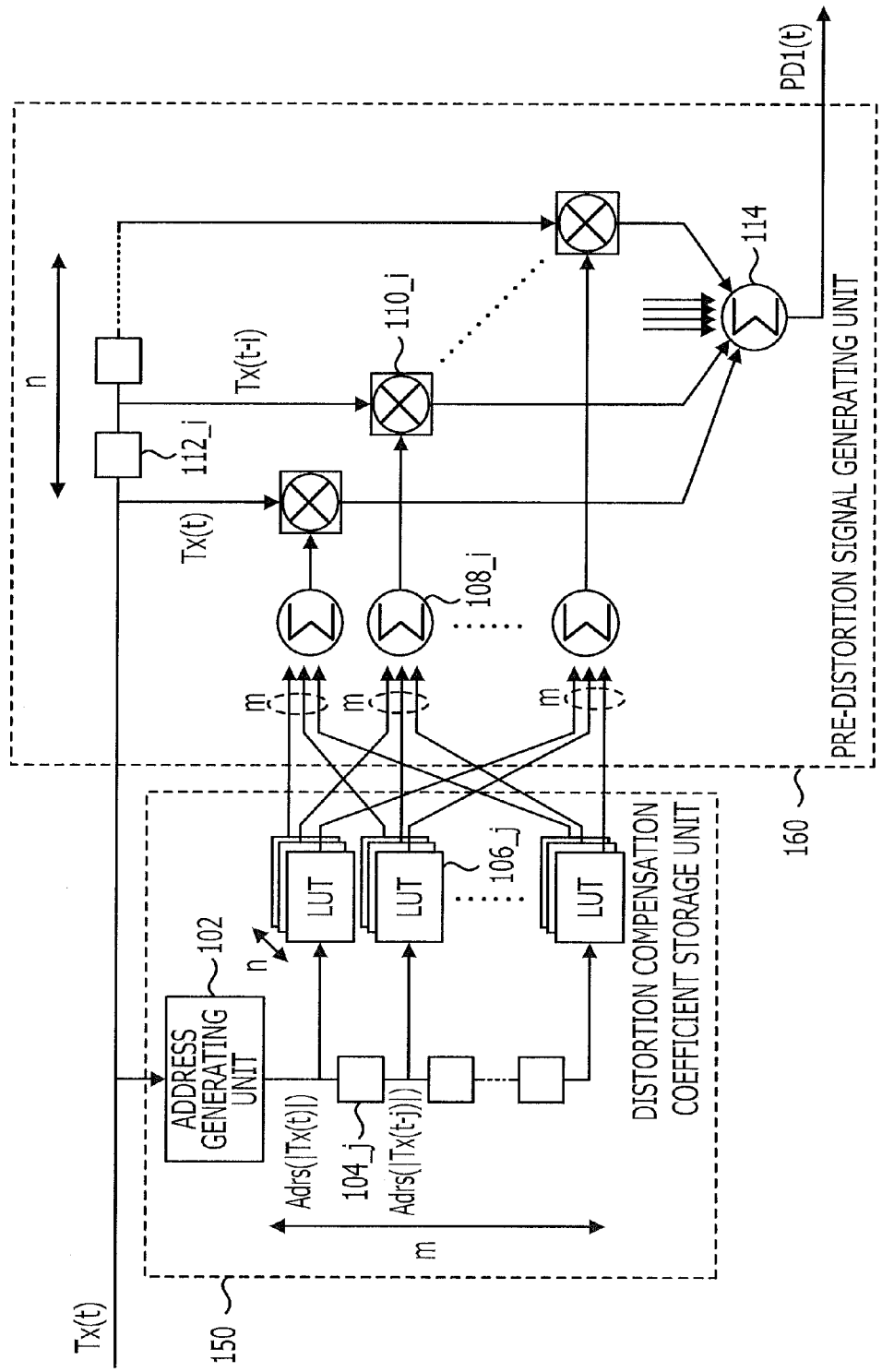
FIG. 1 is a diagram illustrating a part of a distortion compensation coefficient storage unit 150 and a pre-distortion signal generating unit 160 as a part of a plural LUT-type distortion compensation device 100.

FIG. 1 is a diagram illustrating an example of an internal configuration of a plural LUT-type distortion compensation device 100. FIG. 1 illustrates a part of a distortion compensation coefficient storage unit 150 and a pre-distortion signal generating unit 160 as a part of the distortion compensation device 100.

As illustrated in FIG. 1, the distortion compensation coefficient storage unit 150 of the distortion compensation device 100 includes an address generating unit 102, m−1 delay units 104_1 to 104_m−1, and m Look-Up Table (LUT) groups 106_0 to 106_m−1.

Each of the m LUT groups 106_0 to 106_m−1 includes n LUTs. The LUT groups 106_0 to 106_m−1 include n×m LUTs in total.

Hereinafter, the i+1-th LUT included in the LUT group 106_j is referred to as LUT_i,j (i=0 to n−1, j=0 to m−1).

As illustrated in FIG. 1, the pre-distortion signal generating unit 160 of the distortion compensation device 100 includes n adders 108_0 to 108_n−1, n multipliers 110_0 to 110_n−1, n−1 delay units 112_1 to 112_n−1, and an adder 114.

Each of the adders 108_0 to 108_n−1 includes m inputs.

The address generating unit 102 receives a transmission signal Tx(t) and generates an address Adrs (|Tx(t)|) corresponding to the amplitude |Tx(t)| of the transmission signal Tx(t). The generated address Adrs (|Tx(t)|) is supplied to n LUT_i,0 included in the LUT group 106_0.

The delay unit 104_1 receives an address Adrs (|Tx(t)|) generated by the address generating unit 102. By outputting and sequentially delaying the address Adrs (|Tx(t)|) received by the delay unit 104_1 for a period of time corresponding to a difference between the current reference time and the previous reference time, the delay units 104_1 to 104_m−1 generate an address Adrs (|Tx(t−j)|) corresponding to the amplitude |Tx(t−j)| of the transmission signal Tx(t−j) at a reference time t−j.

The generated address Adrs (|Tx(t−j)|) is supplied to n LUT_i,j included in the corresponding LUT group 106_j from among the m LUT groups 106_0 to 106_m−1.

The LUT_i,j included in the LUT group 106_j receives the address Adrs (|Tx(t−j)|) and reads out the distortion compensation coefficient h_i,j (|Tx(t−j)|) (hereinafter referred to as h_i,j) from a position indicated as the received address Adrs (|Tx(t−j)|). The LUT_i,j supplies the read out distortion compensation coefficient h_i,j to the adder 108_i.

The adder 108_i receives the corresponding m distortion compensation coefficients h_i,j from the m LUT groups 106_0 to 106_m−1. The adder 108_i generates a synthesized coefficient h_i(t) by adding the received m distortion compensation coefficients. The adder 108_i supplies the synthesized coefficient h_i(t) to the multiplier 110_i.

The transmission signal Tx(t) is supplied to the multiplier 110_0 and is supplied to the delay unit 112_1.

The delay units 112_1 to 112_n−1 generate a transmission signal Tx(t−i) at the reference time t−i by outputting and sequentially delaying the transmission signal Tx(t) received by the delay unit 112_1 for a period of time corresponding to a difference between the current reference time and the previous reference time.

The multiplier 110_i receives the transmission signal Tx(t−i) and the synthesized coefficient h_i(t). The multiplier 118 generates a transmission signal Tx_i(t) by multiplying the transmission signal Tx(t−i) by the synthesized coefficient h_i(t). The multiplier 110_i supplies the generated transmission signal Tx_i(t) to the adder 114.

The adder 114 receives n transmission signals Tx_i(t) from the multipliers 110_0 to 110_n−1. The adder 114 generates a pre-distortion signal PD(t) by adding the n transmission signals Tx_i(t).

The pre-distortion signal PD(t) is generated by the pre-distortion signal generating unit 160 that performs the distortion compensating processing on the transmission signal Tx(t) input into the distortion compensation device 100. The pre-distortion signal PD(t) is a transmission signal that is subjected to the distortion compensating processing.

The pre-distortion signal PD(t) is converted into an analog signal and is subjected to orthogonal modulation and radio frequency conversion. Furthermore, the pre-distortion signal PD(t) is power-amplified by a power amplifier (not illustrated) and is then radio-transmitted.

Figure 2:
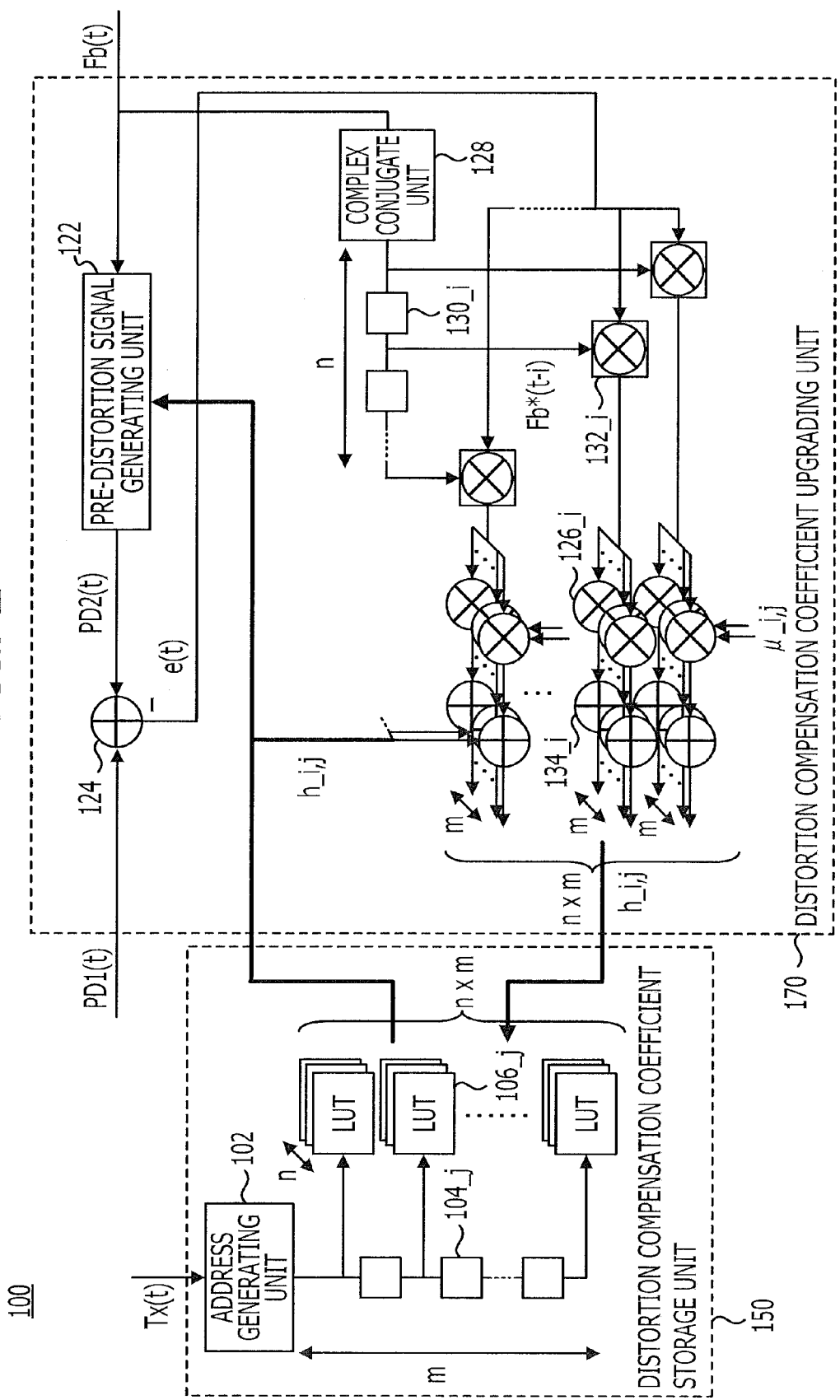
FIG. 2 is a diagram illustrating a part of the distortion compensation coefficient storage unit 150 and a distortion compensation coefficient updating unit 170 of the plural LUT-type distortion compensation device 100.

FIG. 2 is a diagram illustrating an example of an internal configuration of the plural LUT-type distortion compensation device 100 and parts of the distortion compensation coefficient storage unit 150 and a distortion compensation coefficient updating unit 170 of the distortion compensation device 100. In FIG. 2, the signal line indicated as a thick line is expressed to be formed with a plurality of signal lines (n×m signal lines in FIG. 2). The other diagrams have the similar formation.

As illustrated in FIG. 2, the distortion compensation coefficient updating unit 170 includes a pre-distortion signal generating unit 122, an adder 124, n multiplier groups 126_0 to 126_n−1, a complex conjugate unit 128, n delay units 130_1 to 130_n−1, n multipliers 132_0 to 132_n−1, and n adder groups 134_0 to 134_n−1.

Each of the n multiplier groups 126_0 to 126_n−1 includes m multipliers. The multiplier groups 126_0 to 126_n−1 include n×m multipliers in total.

Each of the n adder groups 134_0 to 134_n−1 includes m adders. The adder groups 134_0 to 134_n−1 include n×m adders in total.

The pre-distortion signal generating unit 122 includes a circuit configuration that is equivalent to the pre-distortion signal generating unit 160 illustrated in FIG. 1.

The distortion compensation coefficient updating unit 170 receives a pre-distortion signal PD(t) and a feedback signal Fb(t) and also receives the distortion compensation coefficient h_i,j from the LUT_i,j. The feedback signal Fb(t) is generated based on the output signal of the power amplifier that is not illustrated.

Based on the received pre-distortion signal PD(t) and the feedback signal Fb(t), the distortion compensation coefficient updating unit 170 calculates an update value corresponding to the received distortion compensation coefficient h_i,j with respect to each LUT_i,j. That is, the distortion compensation coefficient updating unit 170 executes, by the circuit illustrated in FIG. 2, the calculating processing expressed in the following Formula 1.

$$h\_i,j(|Tx(t-j)|) = h\_i,j(|Tx(t-j)|) + \mu\_i,j \times e(t) \times Fb^*(t-i) \quad \text{[Formula 1]}$$

Based on the calculated update value, the distortion compensation coefficient updating unit 170 updates the distortion compensation coefficient h_i,j in correspondence to the amplitude |Tx(t−j)| of the corresponding transmission signal Tx(t−j) in each LUT_i,j.

As described above, the delay units 104_1 to 104_m−1, and 112_1 to 112_n−1 are provided in the plural LUT-type distortion compensation device 100. By generating a correction component of the distortion compensating processing called a delay term, the plural LUT-type distortion compensation device 100 reflects information of the transmission signal Tx(t−j) at the past reference time t−j on the distortion compensating processing with respect to the transmission signal Tx(t). Therefore, by the distortion compensating processing, the distortion compensation device 100 may compensate the distortion caused by the memory effect of the power amplifier in addition to the non-linear distortion.

The updating processing of the distortion compensation coefficient executed by the distortion compensation coefficient updating unit 170 is explained in the specification and diagrams of the earlier filed patent application (Patent Application No. 2010-236432) applied by the applicant of the present application.

Figure 3A:
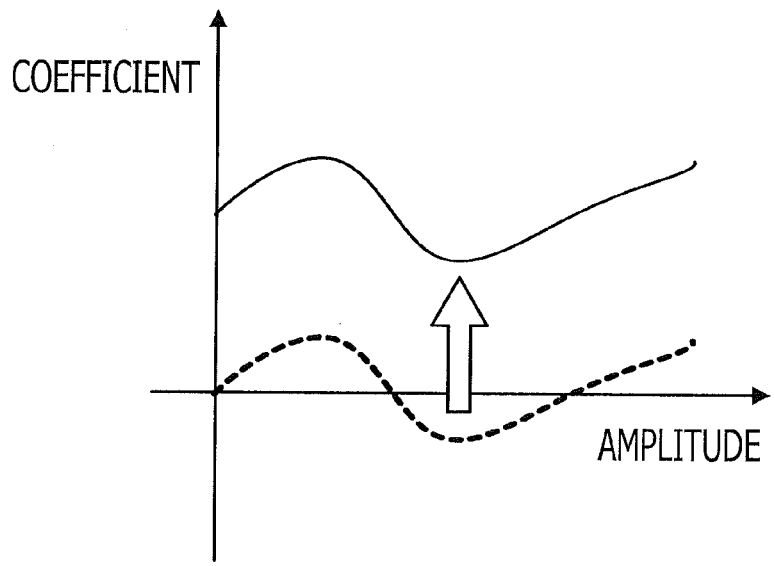
FIG. 3A and FIG. 3B are diagrams illustrating an example of distribution of the distortion compensation coefficients that are subjected to distortion compensating processing and updating processing of the distortion compensation coefficient for a certain period of time in the distortion compensation device 100.
Figure 3B:
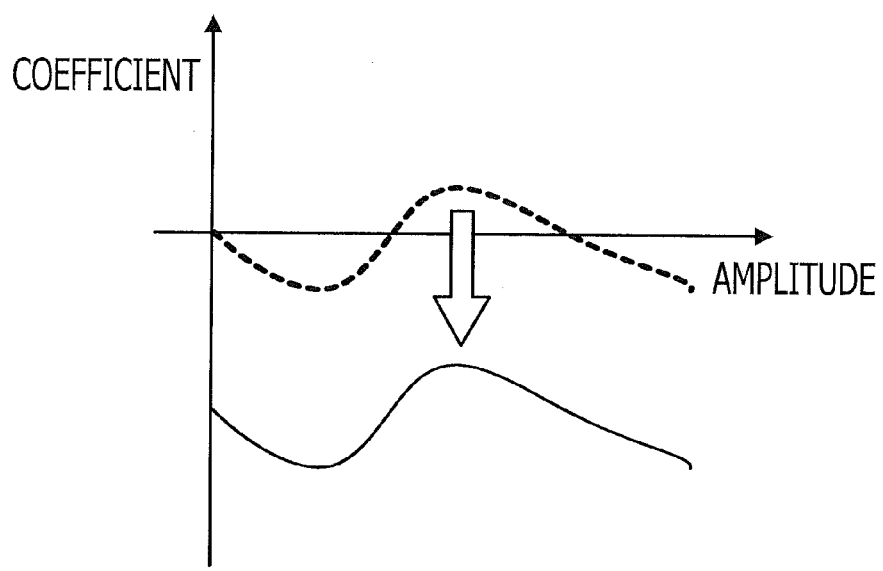

FIG. 3 is a diagram illustrating an example of distribution of the coefficients after the distortion compensating processing and the updating processing of the distortion compensation coefficient are performed for a certain period of time in the distortion compensation device 100. FIG. 3A and FIG. 3B illustrate the distribution of the distortion compensation coefficients in LUT_1,0 and LUT_1,1 in a case of n=2, m=2, for example, in the distortion compensation device 100 illustrated in FIG. 1 and FIG. 2. The longitudinal axis indicates a real part (I channel component) or an imaginary part (Q channel component) of the distortion compensation coefficient. The horizontal axis indicates an address (amplitude of a transmission signal) inside the LUT corresponding to the distortion compensation coefficient.

The inventor of the present application discovered that, regarding the updating processing of the distortion compensation coefficient performed as illustrated in Formula 1, for example, when the distortion compensation coefficient in either LUT_1,0 or LUT_1,1 has a certain offset, the distortion compensation coefficient has an offset that is opposite to the offset generated in one LUT so that the other LUT compensates the certain offset.

Regarding this phenomenon, it is considered that, for example, the multiplier 110_i illustrated in FIG. 1 performs the multiplying processing on the transmission signal Tx(t−1) by using the distortion compensation coefficient h_1,0 output from the LUT_1,0 and the synthesized coefficient h_i(t) obtained by adding the distortion compensation coefficient h_1,1 output from the LUT_1,1.

For example, if the distortion compensation coefficient in the LUT_1,0 has an offset in the plus direction by the distortion compensation coefficient, the values of the distortion compensation coefficients is collected in such a way that the offset is compensated, that is, the offset generated in the synthesized coefficient h_1(t) becomes smaller in the LUT_1,1. At this time, since the offset of the distortion compensation coefficient of the LUT_1,0 is in the plus direction, an offset in the minus direction that is opposite to the offset in the plus direction in the LUT_1,0 is generated.

As a result, if the update of the distortion compensation coefficient proceeds, as for distortion compensation coefficient distribution of the LUT_1,0 and the LUT_1,1, the value of each distortion compensation coefficient tends to increase or decrease in such a way that the values of the distortion compensation values are mutually compensated. Therefore, in the distortion compensation device 100, the amplitude of the distortion compensation coefficient (absolute value) becomes excessively large as the distortion compensation coefficient is updated. In the worst case, the amplitude is considered to be clipped to the upper limit or the lower limit in a limited coefficient setting range that is specified to a storage amount of each LUT. Accordingly, the distortion compensation device 100 is desired to have a storage area of the distortion compensation coefficient in each LUT to prevent deterioration of the distortion compensation characteristic caused by a clip of the distortion compensation coefficient.

Therefore, in the distortion compensation device as an aspect of the embodiment, even if the update of the distortion compensation coefficient proceeds, the amplitude (absolute value) of the distortion compensation coefficient is prevented from excessively increasing.

1. First Embodiment

A radio communication device and a distortion compensation device according to a first embodiment will be described below.

[1-1. Configuration Example if Radio Communication Device 400]

Figure 4:
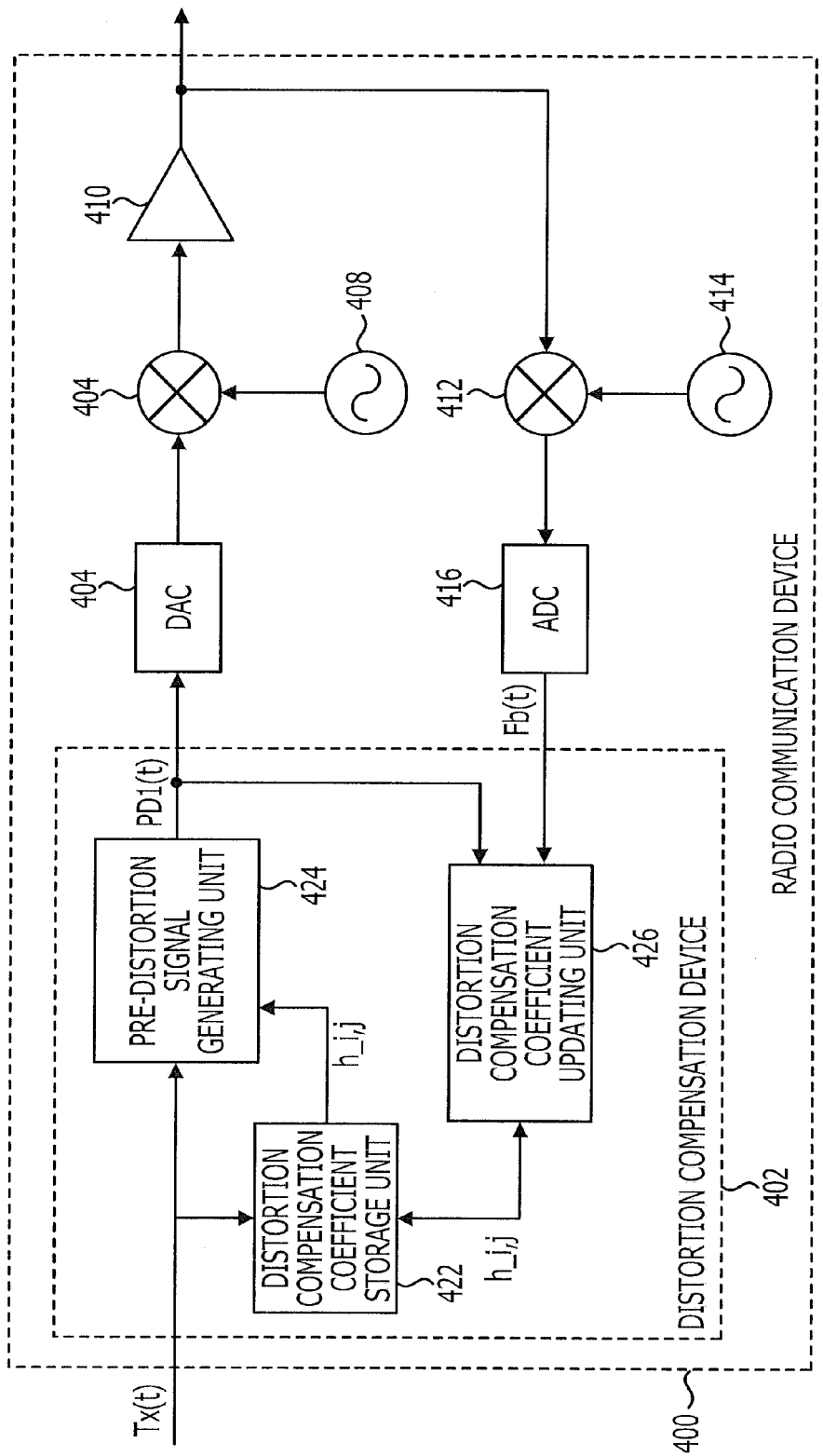
FIG. 4 is a diagram illustrating an example of a configuration of a radio communication device 400 that includes a plural LUT-type distortion compensation device 402.

FIG. 4 is a diagram illustrating an example of a configuration of a radio communication device 400 that includes a plural LUT-type distortion compensation device 402. As illustrated in FIG. 4, the radio communication device 400 includes a distortion compensation device 402, a digital/analog converter (DAC) 404, an up-converter 406, a standard carrier wave generator 408, a power amplifier 410, a down-converter 412, a standard carrier wave generator 414, and an analog/digital converter (ADC) 416.

The distortion compensation device 402, which is a plural LUT-type distortion compensation device, includes a distortion compensation coefficient storage unit 422, a pre-distortion signal generating unit 424, and a distortion compensation coefficient updating unit 426. For example, the distortion compensation coefficient storage unit 422 includes a circuit configuration that is equivalent to the distortion compensation coefficient storage unit 150 illustrated in FIG. 1. For example, the pre-distortion signal generating unit 424 includes a circuit configuration that is equivalent to the pre-distortion signal generating unit 160 illustrated in FIG. 1.

The distortion compensation device 402 receives the transmission signal Tx(t) from a transmission signal generation device that is not illustrated and generates a pre-distortion signal PD1(t) by the distortion compensation coefficient storage unit 422 and the pre-distortion signal generating unit 424. The generating processing of the pre-distortion signal PD1(t) is equivalent to the processing described to be related to the distortion compensation coefficient storage unit 150 and the pre-distortion signal generating unit 160, so that the detailed description is omitted.

The pre-distortion signal PD1(t) is converted into an analog signal by the DAC 404. The up-converter 406 receives the converted pre-distortion signal, performs the orthogonal modulation by using the standard carrier wave supplied from the standard carrier wave generator 408, and performs frequency conversion on the pre-distortion signal so that the pre-distortion signal has a radio frequency. The power amplifier 410 receives the pre-distortion signal that is subjected to the orthogonal modulation and the frequency conversion and generates a radio transmission signal by performing power amplification of the received pre-distortion signal. The power amplifier 410 radio-transmits a radio transmission signal through an antenna that is not illustrated and feeds back the radio transmission signal to the down-converter 412.

The down-converter 412 receives the fed back radio transmission signal and performs the frequency conversion into an AD convertible frequency band by using the standard carrier wave generator 414. The signal that is subjected to the frequency conversion is converted into a digital signal by the ADC 416 and is then supplied to the distortion compensation coefficient updating unit 426 as a feedback signal Fb(t).

The distortion compensation coefficient updating unit 426 receives the feedback signal Fb(t) and also receives the pre-distortion signal PD1(t) from the pre-distortion signal generating unit 424. The distortion compensation coefficient updating unit 426 receives the distortion compensation coefficient from each of the plurality of LUTs inside the distortion compensation coefficient storage unit 422. By performing adaptive control processing using a Least Mean Square (LMS) algorithm, the distortion compensation coefficient updating unit 426 updates the value of the distortion compensation coefficient stored in each of the plurality of LUTs inside the distortion compensation coefficient storage unit 422. The details of the distortion compensation coefficient updating unit 426 will be described below.

The distortion compensation device 402 may be achieved by, for example, a digital signal processing device such as a FPGA and an ASIC or a processor such as a DSP. The distortion compensation device 402 may be achieved as a single element or a combination of a plurality of elements with some functions of the distortion compensation device 402, respectively. The LUT included in the distortion compensation device 402 is achieved by a storage device such as an independent RAM.

[1-2. Configuration Example of Distortion Compensation Coefficient Updating Unit 426]

Figure 5:
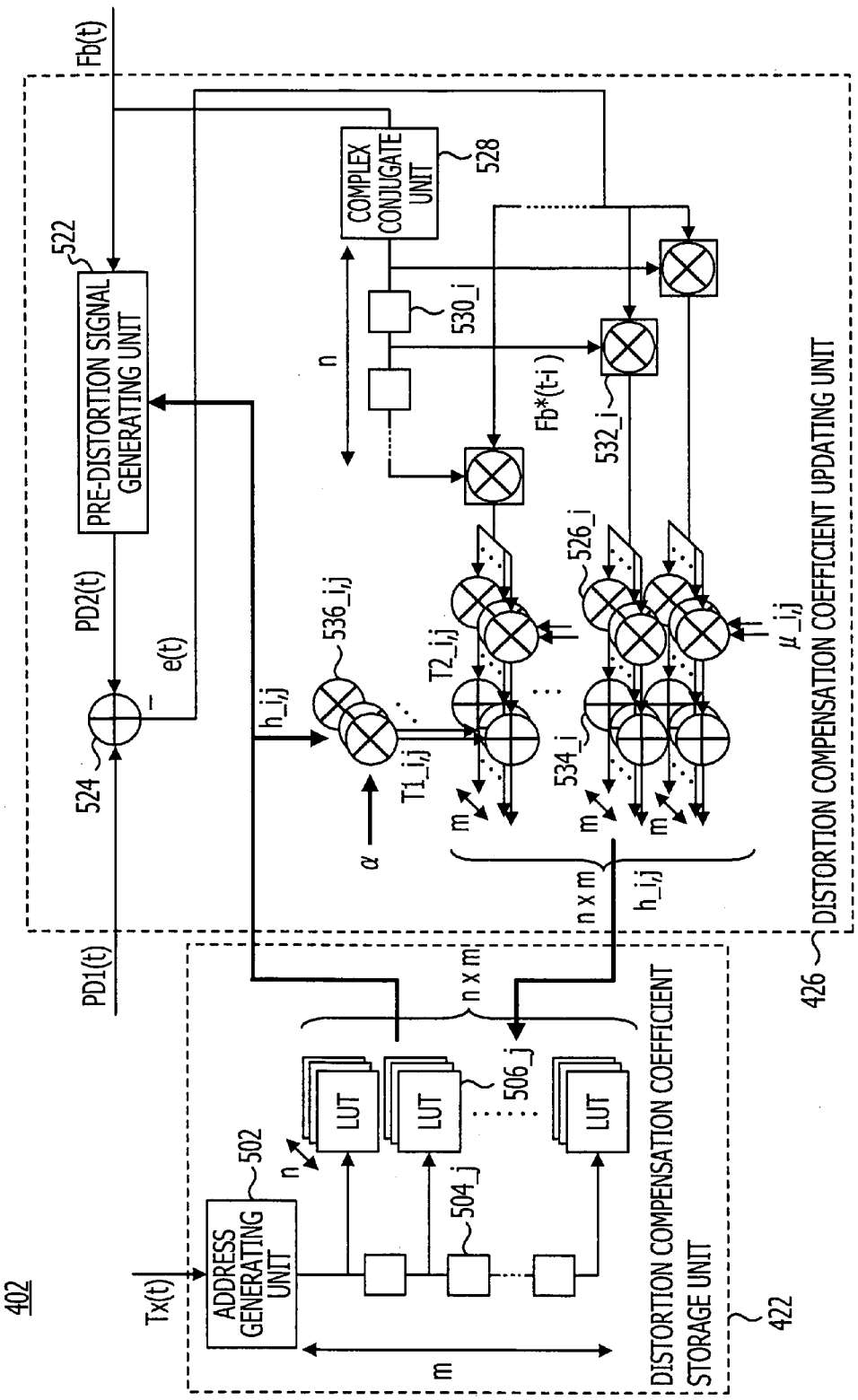
FIG. 5 is a diagram illustrating an example of an internal configuration of a distortion compensation coefficient updating unit 426.

FIG. 5 is a diagram illustrating an example of an internal configuration of the distortion compensation coefficient updating unit 426. With reference to FIG. 5, a configuration example of the distortion compensation coefficient updating unit 426 will be described below. In FIG. 5, the distortion compensation coefficient storage unit 422 is illustrated as well for the explanation.

As illustrated in FIG. 5, the distortion compensation coefficient storage unit 422 of the distortion compensation device 402 includes an address generating unit 502, m−1 delay units 504_1 to 504_m−1, and m LUT groups 506_0 to 506_m−1.

Each of the m LUT groups 506_0 to 506_m−1 includes n LUTs. The LUT groups 506_0 to 506_m−1 include n×m LUTs in total.

Hereinafter, the i+1-th LUT included in the LUT group 506_j is referred to as LUT_i,j (i=0 to n−1, j=0 to m−1). As illustrated in FIG. 5, the distortion compensation coefficient updating unit 426 includes a pre-distortion signal generating unit 522, a subtracter 524, n multiplier groups 526_0 to 526_n−1, a complex conjugate unit 528, n delay units 530_1 to 530_n−1, n multipliers 532_0 to 532_n−1, n adder groups 534_0 to 534_n−1, and n×m multiplier groups 536_i,j (i=0 to n−1, j=0 to m−1).

Each of the m multiplier groups 526_0 to 526_n−1 includes m multipliers. The multipliers groups 526_0 to 526_n−1 include n×m multipliers in total. Hereinafter, the j+1-th multiplier included in the multiplier group 526_i is referred to as MUL_i, j (i=0 to n−1, j=0 to m−1).

Each of the n adder groups 534_0 to 534_n−1 includes m adders. The adder groups 534_0 to 534_n−1 include n×m LUTs in total. Hereinafter, the j+1-th adder included in the adder group 534_i is referred to as ADD_i,j (i=0 to n−1, j=0 to m−1).

The n×m multipliers 536_i,j are provided to correspond to n×m LUT_i,j, respectively.

For example, the pre-distortion signal generating unit 522 includes a circuit configuration that is equivalent to the pre-distortion signal generating unit 101 illustrated in FIG. 1. Therefore, the detailed description is omitted.

The distortion compensation coefficient updating unit 426 receives the pre-distortion signal PD1(t) from the pre-distortion signal generating unit 424 and receives the feedback signal Fb(t) from the ADC 416. Furthermore, the distortion compensation coefficient updating unit 426 receives the distortion compensation coefficient from each LUT_i,j inside the distortion compensation coefficient storage unit 422.

Based on the received pre-distortion signal PD1(t) and the received feedback signal Fb(t), the distortion compensation coefficient updating unit 426 calculates an update value corresponding to the received distortion compensation coefficient $h\_i,j$ with respect to each LUT_i,j. That is, the distortion compensation coefficient updating unit 426 executes, by the circuit illustrated in FIG. 5, the calculating processing expressed in Formula 2.

$$h\_i,j(|Tx(t-j)|) = \alpha \times h\_i,j(|Tx(t-j)|) + \mu\_i,j \times e(t) \times Fb^*(t-i)$$ [Formula 2]

The pre-distortion signal generating unit 522 receives the feedback signal Fb(t) and the distortion compensation coefficient h_i,j to generate a pre-distortion signal PD2(t) corresponding to the received feedback signal Fb(t). The pre-distortion signal PD2(t) is generated by executing processing, which is equivalent to the distortion compensating processing executed on the transmission signal Tx(t) in the pre-distortion signal generating unit 424, on the feedback signal Fb(t). That is, the pre-distortion signal PD2(t) is a feedback signal that is subjected to the distortion compensating processing. The pre-distortion signal generating unit 522 supplies the generated pre-distortion signal PD 2(t) to the subtractor 524.

The subtractor 524 receives the pre-distortion signals PD1(t) and PD2(t) and calculate an error signal e(t) by obtaining a difference between the pre-distortion signal PD1(t) and the pre-distortion PD2(t). The subtractor 524 supplies the calculated error signal e(t) to the multipliers 532_0 to 532_n−1.

$$e(t)=PD1(t)-PD2(t)$$

The complex conjugate unit 528 receives the feedback signal Fb(t) and calculates a complex conjugate signal Fb*(t) of the received feedback signal. The complex conjugate unit 528 supplies the calculated complex conjugate feedback signal Fb* to the delay unit 530_1.

The delay units 530_1 to 530_n−1 generate a complex conjugate signal Fb*(t−i) at the reference time t−i by outputting and sequentially delaying the complex conjugate signal Fb*(t) received by the delay unit 530_1 for a period of time corresponding to a difference between the current reference time and the previous reference time.

The multiplier 532_i receives the error signal e(t) and the complex conjugate feedback signal Fb*(t−i) and multiplies the received error signal e(t) by the complex conjugate feedback signal Fb*(t−i).

The MUL_i,j included in the multiplier group 526_i receives the multiplication result from the multiplier 532_i and also receives an attenuation coefficient μ_i,j called a step size parameter. The attenuation coefficient μ_i,j is a parameter that adjusts the size of the second term as a correction term that conjugates the distortion compensation coefficients in the above-described Formula 2. The attenuation coefficient μ_i,j is set individually according to each LUT_i,j. The attenuation coefficient μ_i,j is stored as a table in a storage device (not illustrated) such as a Random Access Memory (RAM), for example.

By multiplying the multiplication result of the multiplier 532_i by the attenuation coefficient μ_i,j, the multiplier MUL_i,j generates a signal T2_i,j corresponding to the second term of the above-described Formula 2. The multiplier MUL_i,j supplies the generated signal T2_i,j to the adder ADD_i,j included in the corresponding adder group 534_i.

$$T2\_i,j=\mu\_i,j\times e(t)\times Fb^*(t-i)$$

The multiplier 536_i,j receives the distortion compensation coefficient h_i,j from the corresponding LUT_i,j inside the distortion compensation coefficient storage unit 422 and also receives an inhibit coefficient a.

The inhibit coefficient α is a parameter of weighting with respect to the distortion compensation coefficient h_i,j. By adjusting the size of the first term that is to be corrected in the above-described Formula 2, the parameter prevents the update value (the left side of Formula 2) of the distortion compensation coefficient from increasing.

In the example illustrated in FIG. 5, the inhibit coefficient α includes the common value with respect to each LUT_i,j. The inhibit coefficient α is stored in a storage device (not illustrated) such as a RAM, for example. The value of the inhibit coefficient α is set between 0 and 1 (0≤a≤1). It is preferable that the value of the inhibit coefficient α is determined in consideration of the characteristic of increase or decrease of the distortion compensation coefficient in association with the updating processing.

The multiplier 536_i,j performs the weighting processing by multiplying the received distortion compensation coefficient h_i,j by the inhibit coefficient α to generate the signal T1_i,j corresponding to the first term of the above-described Formula 2. The multiplier 536_i,j supplies the generated signal T1_i,j to the adder ADD_i,j.

$$T1\_i,j=a\times h\_i,j$$

The adder ADD_i,j included in the adder group 534_i receives the signal T1_i,j from the multiplier 536_i,j and receives the signal T2_i,j from the multiplier MUL_i,j. The adder ADD_i,j generates the update value corresponding to the distortion compensation coefficient h_i,j, as illustrated in Formula 2, by adding the signal T1_i,j and the signal T2_i,j.

$$h\_i,j=T1\_i,j+T2\_i,j$$

The adder ADD_i,j supplies the update value of the generated distortion compensation coefficient h_i,j to the corresponding LUT_i,j.

Each LUT_i,j receives the update value of the distortion compensation coefficient h_i,j from the corresponding adder ADD_i,j and updates the distortion compensation coefficient h_i,j in correspondence to the amplitude |Tx(t−j)| of the corresponding transmission signal Tx(t−j) based on the received update value.

As described above, when performing the updating processing of the distortion compensation coefficient, the distortion compensation coefficient updating unit 426 of the distortion compensation device 402 corrects the distortion compensation coefficient based on the error signal after the amplitude (absolute value) of the distortion compensation coefficient is reduced by the weighting processing by the inhibit coefficient. Therefore, each of the LUTs of the distortion compensation device 402 repeats the updating processing of the distortion compensation coefficient. Even if the updating processing proceeds, the amplitude (absolute value) of the distortion compensation coefficient is prevented from excessively increasing.

The distortion compensation device 402 properly adjusts the degree of weighting with respect to the distortion compensation coefficient by using the inhibit coefficient α. Therefore, in the distortion compensation device 402, the weighting processing may reduce the influence on convergence of the distortion compensation coefficient in the updating processing in each LUT.

According to the above-described embodiments, as for the attenuation coefficient, the values are set individually according to each LUT_i,j. However, the value is not limited to the above-described embodiment. For example, the value may be the common value with respect to each LUT_i,j.

[1-3. Example of Updating Operation of Distortion Compensation Coefficient in Distortion Compensation Device 402]

Figure 6:
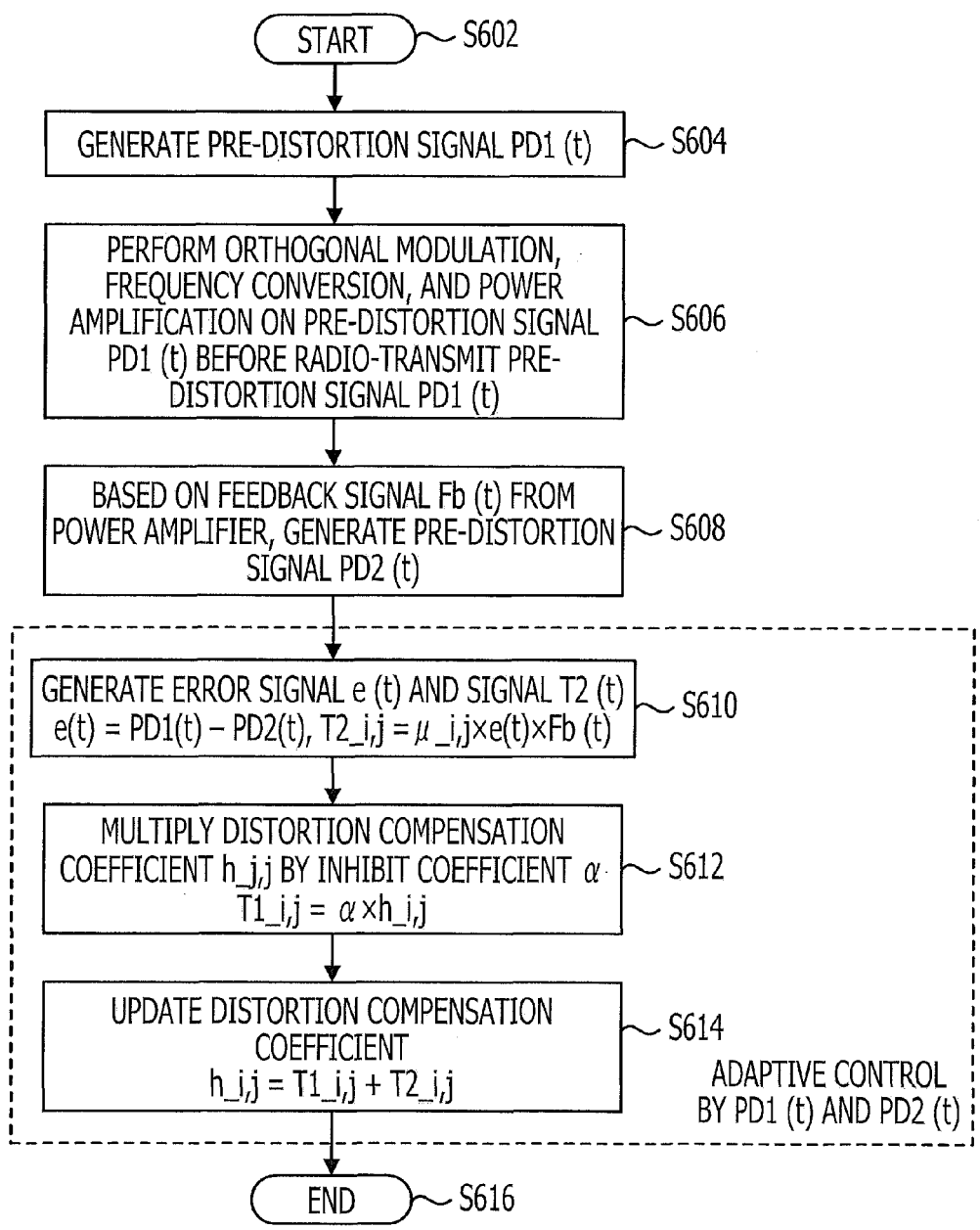
FIG. 6 is a diagram illustrating an example of a flowchart of the updating processing of the distortion compensation coefficient in the distortion compensation device 402.

FIG. 6 is a diagram illustrating an example of a flowchart of updating processing of a distortion compensation coefficient in the distortion compensation device 402. With reference to the flowchart illustrated in FIG. 6, the updating processing of the distortion compensation coefficient will be described below.

In Operation S602, the distortion compensation device 402 starts the updating processing of a sequence distortion compensation coefficient.

In Operation S604, the pre-distortion signal generating unit 424 generates the pre-distortion signal PD1(t) based on the input transmission signal Tx(t).

In Operation S606, the power amplifier 410 amplifies the power of the pre-distortion signal PD1(t) that is subjected to the orthogonal modulation and the frequency conversion and then radio-transmits the power-amplified pre-distortion signal through an antenna.

In Operation S608, the distortion compensation coefficient updating unit 426 receives the feedback signal Fb(t) from the power amplifier 410 and generates the pre-distortion signal PD2(t) by performing the distortion compensating processing on the received feedback signal Fb(t).

In Operation S610, the distortion compensation coefficient updating unit 426 generates the error signal e(t) between the pre-distortion signal PD1(t) generated in Operation S604 and the pre-distortion signal PD2 generated in Operation S606. Furthermore, the distortion compensation coefficient updating unit 426 generates the signal T2_i,j corresponding to the second term of the update formula of the distortion compensation coefficient expressed in Formula 2.

In Operation S612, the distortion compensation coefficient updating unit 426 receives the distortion compensation coefficient h_i,j from each LUT_i,j and performs the weighting processing by multiplying the received distortion compensation coefficient h_i,j by the inhibit coefficient α. By the weighting processing, the distortion compensation coefficient updating unit 426 generates the signal T1_i,j corresponding to the first term of the update formula of the distortion compensation coefficient expressed in Formula 2.

In Operation S614, the distortion compensation coefficient updating unit 426 calculates the update value of the distortion compensation coefficient based on the update formula of the distortion compensation coefficient expressed in Formula 2 by adding the signal T2_i,j generated in Operation S610 and the signal T1_i,j generated in Operation S612. Based on the calculated update value, each LUT_i,j updates the distortion compensation coefficient.

In Operations S610 to S614, the distortion compensation coefficient updating unit 426 performs adaptive control processing by the pre-distortion signals PD1(t) and PD2(t). A Least Mean Square (LMS) algorithm is given as an example of an algorithm used for the adaptive control processing.

In Operation S616, the distortion compensation device 402 ends the updating processing of the distortion compensation coefficient.

As described above, in Operation S612, the distortion compensation device 402 reduces the amplitude (absolute value of the distortion compensation coefficient by the weighting processing by the inhibit coefficient. After that, in Operation S614, the distortion compensation device 402 executes the updating processing of the distortion compensation coefficient by correcting the distortion compensation coefficient based on the error signal. Therefore, the updating processing of the distortion compensation coefficient is repeated.

Even if the update proceeds, the amplitude (absolute value) of the distortion compensation coefficient is prevented from excessively increasing.

The distortion compensation device 402 performs the weighting processing on the distortion compensation coefficient using the inhibit coefficient a in Operation S612. Therefore, by properly setting the value of the inhibit coefficient α, the influence on the convergence of the distortion compensation coefficient in the updating processing may be suppressed in each LUT.

According to the above-described embodiments, for example, the distortion compensation device 402 performs the adaptive control processing in Operations S610 to S614 by the distortion compensation coefficient updating unit 426 using hardware. However, the embodiment is not limited to the example. For example, the distortion compensation device 402 is provided with a predetermined processor and the program may be executed by the predetermined processor.

2. Second Embodiment

A radio communication device and a distortion compensation device according to a second embodiment will be described.

[2-1. Configuration Example of Distortion Compensation Coefficient Updating Unit 726]

The configuration of the radio communication device 700 according to the second embodiment is different from the configuration of the radio communication device 400 illustrated in FIG. 4 in that the configuration of the radio communication device 700 includes the distortion compensation device 702 and a distortion compensation coefficient updating unit 726 instead of the distortion compensation device 402 and the distortion compensation coefficient updating unit 426. However, the other parts of the configuration of the radio communication device 700 are equivalent to the radio communication device 400. Thus, the illustration of the configuration of the radio communication device 700 is omitted.

Figure 7:
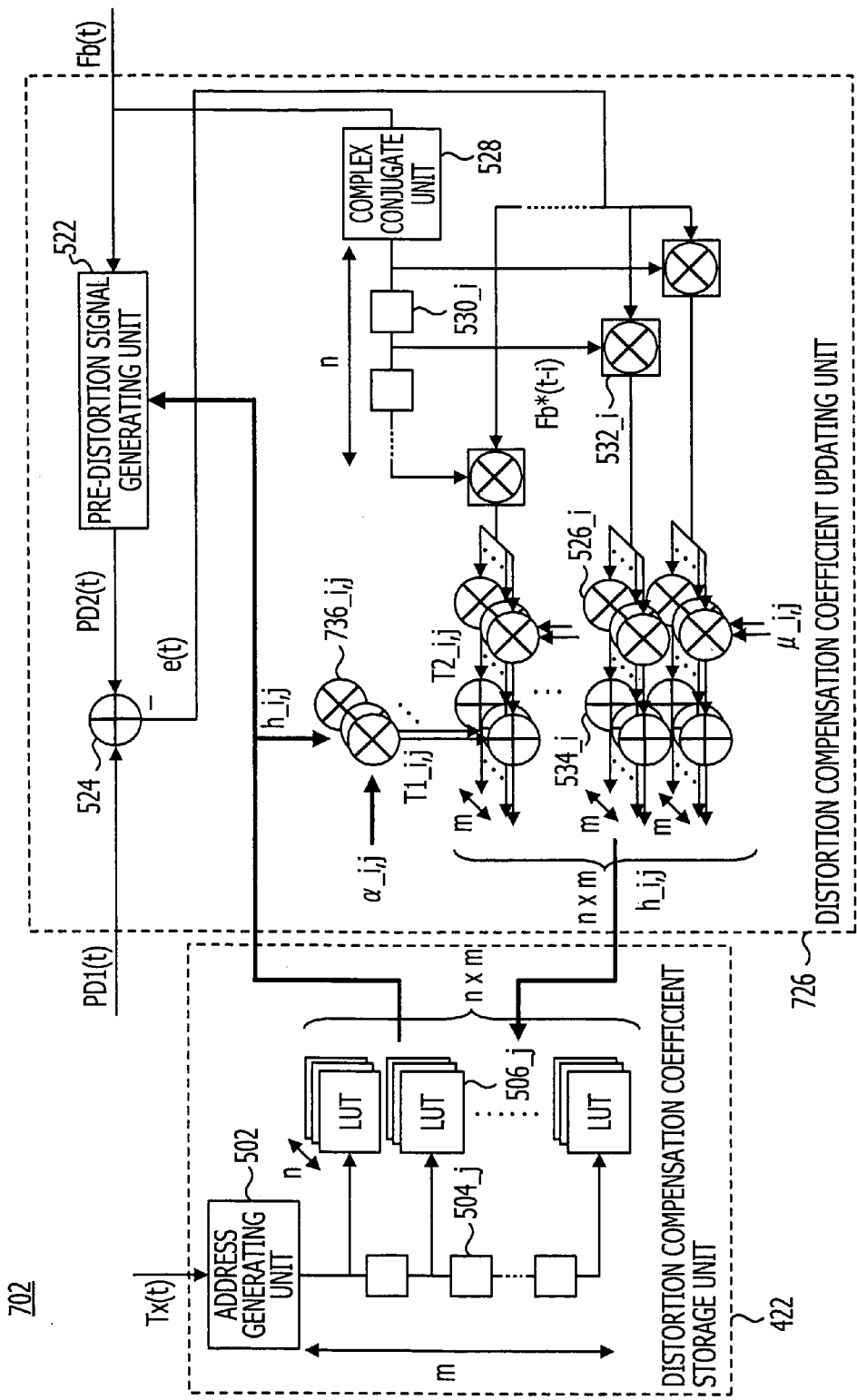
FIG. 7 is a diagram illustrating an example of an internal configuration of a distortion compensation coefficient updating unit 726.

FIG. 7 is a diagram illustrating an example of an internal configuration of the distortion compensation coefficient updating unit 726. The internal configuration of the distortion compensation coefficient updating unit 726 is different from the internal configuration of the distortion compensation coefficient updating unit 426 illustrated in FIG. 5 in that the internal configuration of the distortion compensation coefficient updating unit 726 includes a multiplier 736_i,j instead of the multiplier 536_i,j. However, the other parts of the internal configuration of the distortion compensation coefficient updating unit 726 are equivalent to the distortion compensation coefficient updating unit 426. In FIG. 7, the parts that are equivalent to or correspond to the distortion compensation coefficient updating unit 426 illustrated in FIG. 5 are indicated with the similar numerals.

As illustrated in FIG. 7, the distortion compensation coefficient updating unit 726 includes the multiplier 736_i,j. Based on the pre-distortion signal PD1(t) and the feedback signal Fb(t), the distortion compensation coefficient updating unit 726 calculates an update value corresponding to the distortion compensation coefficient h_i,j with respect to each LUT_i,j. That is, the distortion compensation coefficient updating unit 726 executes, by the circuit illustrated in FIG. 7, the calculating processing illustrated as the following Formula 3. The first term of the following Formula 3 is different from the first term of the above-described Formula 2. However, the second term of Formula 3 is equivalent to Formula 2.

$$h\_i,j(|Tx(t-j)|) = \alpha\_i,j \times h\_i,j(|Tx(t-j)|) + \mu\_i,j \times e(t) \times Fb^*(t-i) \qquad \text{[Formula 3]}$$

The multiplier 736_i,j receives the distortion compensation coefficient h_i,j from the corresponding LUT_i,j inside the distortion compensation coefficient storage unit 422 and also receives the inhibit coefficient α_i,j. The inhibit coefficient α_i,j is a parameter of weighting corresponding to the distortion compensation coefficient. The parameter prevents the update value (the left side of Formula 3) of the distortion compensation coefficient from increasing by adjusting the size of the first term to be corrected in the above-described Formula 3.

As illustrated in FIG. 7, the inhibit coefficient α_i,j has a value that is set individually to each LUT_i,j. The inhibit coefficient α_i,j is prepared in advance as a table. For example, the α_i,j is stored in the storage device (not illustrated) as a RAM, for example. The value of the inhibit coefficient α_i,j is properly set between 0 and 1 ($0 \le \alpha\_i,j \le 1$). It is preferable that the value of the inhibit coefficient α_i,j is determined in consideration with the characteristic of the memory effect of the power amplifier and the characteristic of the increase or decrease of the number of distortion compensation coefficients in association with the updating processing.

Furthermore, if the memory effect of the power amplifier 410 is small, a small value is set to the distortion compensation coefficient h_i,j that has a time distance from the current reference time t is far, that is, the value of i or j is large. For example, it is preferable that a smaller value as the value of i or j is increased is set to the inhibit coefficient α_i,j. If the memory effect of the power amplifier 410 is small, the influence of the delay term (correction component of the distortion compensating processing) generated by providing the delay units 104_1 to 104_m−1 and 112_1 to 112_n−1 becomes small when the pre-distortion signal generating unit 424 generates the pre-distortion signal PD1(t). Especially, if the degree (the value of i or j) of the delay term becomes larger, the influence on the delay term is considered to become smaller.

The multiplier 736_i,j performs the weighting processing by multiplying the distortion compensation coefficient h_i,j received from LUT_i,j by the inhibit coefficient α_i,j to generate a signal T1_i,j corresponding to the first term of the above-described Formula 3. The multiplier 736_i,j supplies the generated signal T1_i,j to the corresponding adder ADD_i,j.

The operation of the other parts of the distortion compensation device 702 illustrated in FIG. 7 is equivalent to the parts corresponding to the distortion compensation device 402 illustrated in FIG. 4, so that the description is omitted.

As described above, the distortion compensation coefficient updating unit 726 of the distortion compensation device 702 sets the inhibit coefficient to each LUT_i,j individually, so that the inhibit coefficient is set to be an appropriate value for each LUT_i,j according to the memory effect characteristic of the power amplifier. Therefore, since the degree of weighting by the inhibit coefficient for each LUT_i,j may be properly controlled, the distortion compensation device 702 may prevent the amplitude (absolute value) of the distortion compensation coefficient from excessively increasing while suppressing the influence of the weighting processing on the convergence of the distortion compensation coefficient in the updating processing.

[2-2. Example of Updating Operation of Distortion Compensation Coefficient in Distortion Compensation Device 702]

Figure 8:
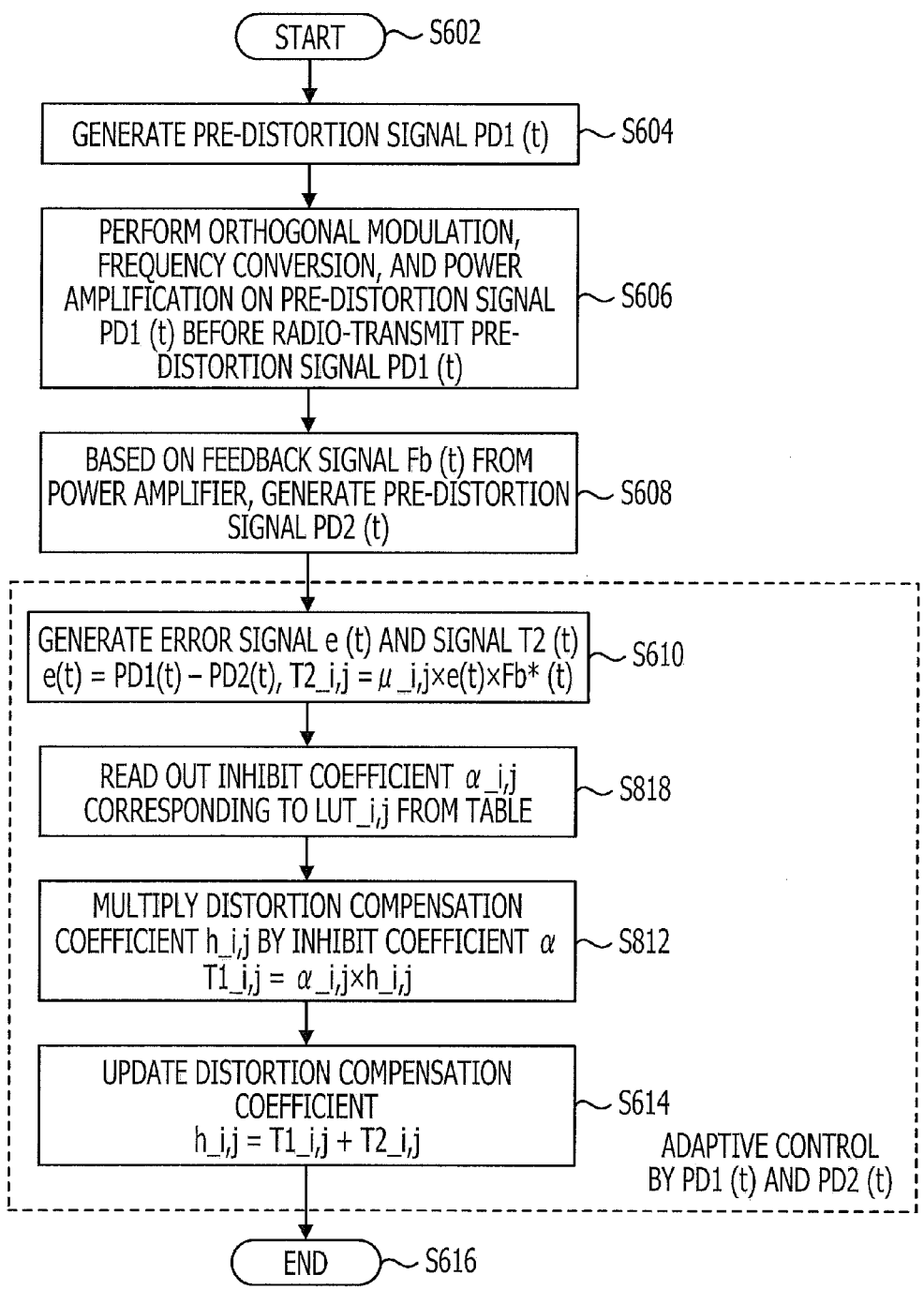
FIG. 8 is a diagram illustrating an example of a flowchart of the updating processing of the distortion compensation coefficient in the distortion compensation device 702.

FIG. 8 is a diagram illustrating an example of a flowchart of updating processing of a distortion compensation coefficient in the distortion compensation device 702.

The flowchart illustrated in FIG. 8 is different from the flowchart illustrated in FIG. 6 in that the flowchart illustrated in FIG. 8 includes Operation S812 instead of Operation S612 and adds Operation S818. In FIG. 8, the parts that are equivalent or correspond to the flowchart illustrated in FIG. 6 are indicated with the similar numerals. With reference to the flowchart illustrated in FIG. 8, the updating processing of the distortion compensation coefficient will be described.

Operations S602 to S610 are equivalent to the processing explained in the flowchart illustrated in FIG. 6, so that the description is omitted.

In Operation S818, the distortion compensation coefficient updating unit 726 reads out the corresponding inhibit coefficient α_i,j from a predetermined table according to LUT_i,j in which the distortion compensation coefficient to be updated is stored.

In Operation S812, the distortion compensation coefficient updating unit 726 receives the distortion compensation coefficient h_i,j from each LUT_i,j and performs the weighting processing by multiplying the received distortion compensation coefficient h_i,j by the inhibit coefficient α_i,j. By performing the weighting processing, the distortion compensation coefficient updating unit 726 generates the signal T1_i,j that corresponds to the first term of the update formula of the distortion compensation coefficient illustrated in Formula 3.

Operations S614 and S616 are equivalent to the processing explained in the flowchart illustrated in FIG. 6, so that the description is omitted.

In Operations S610, S818, S812, and S614, the distortion compensation coefficient updating unit 726 performs adaptive control processing with the pre-distortion signals PD1(t) and PD2(t).

As described above, the distortion compensation device 702 reads out the inhibit coefficient that is set individually to each LUT_i,j in Operation S818. Thus, in the updating processing of the distortion compensation coefficient, the appropriate inhibit coefficient may be used for each LUT_i,j according to the memory effect characteristic of the power amplifier. Therefore, in Operation S812, since the degree of the weighting by the inhibit coefficient may be properly controlled for each LUT_i,j, the distortion compensation device 702 may prevent the amplitude (absolute value) of the distortion compensation coefficient from excessively increasing while suppressing the influence on the convergence of the distortion compensation coefficient in the updating processing.

In the above-described embodiment, there is an example in which the distortion compensation device 702 performs the adaptive control processing of Operations S610, S818, S812, and S614 by the distortion compensation coefficient updating unit 726 using the hardware. However, the embodiment is not limited to the example. For example, a predetermined processor may be provided in the distortion compensation device 702, and the processor may execute the processing illustrated in Operations S610, S818, S812, and S614 by the program.

3. Third Embodiment

A radio communication device and a distortion compensation device according to a third embodiment will be described.

[3-1. Configuration Example of Distortion Compensation Coefficient Updating Unit 926]

The configuration of the radio communication device 900 according to the third embodiment is different from the configuration of the radio communication device 400 illustrated in FIG. 4 in that the configuration of the radio communication device 900 includes a distortion compensation device 902 and a distortion compensation coefficient updating unit 926 instead of the distortion compensation device 402 and the distortion compensation coefficient updating unit 426. The other parts of the configuration of the radio communication device 900 are equivalent to the radio communication device 400. Therefore, the illustration of the configuration of the radio communication device 900 is omitted.

Figure 9:
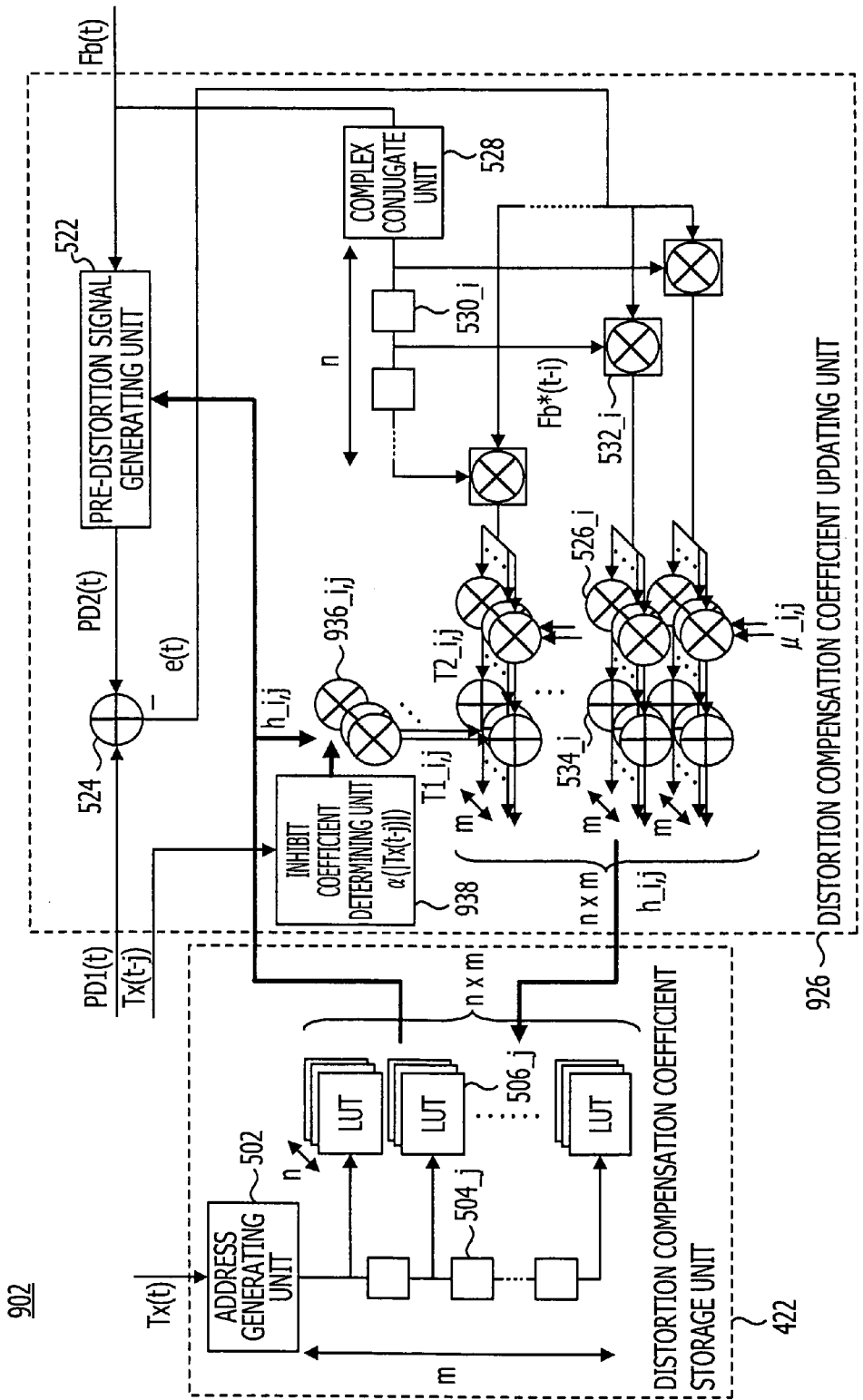
FIG. 9 is a diagram illustrating an example of an internal configuration of a distortion compensation coefficient updating unit 926.

FIG. 9 is a diagram illustrating an example of an internal configuration of the distortion compensation coefficient updating unit 926. The internal configuration of the distortion compensation coefficient updating unit 926 is different from the internal configuration of the distortion compensation coefficient updating unit 426 illustrated in FIG. 5 in that the internal configuration of the distortion compensation coefficient updating unit 926 has a multiplier 936_i,j and an inhibit coefficient determining unit 938 instead of the multiplier 536_i,j. The other parts of the distortion compensation coefficient updating unit 926 are equivalent to the distortion compensation coefficient updating unit 426. In FIG. 9, the parts that are equivalent or correspond to the distortion compensation coefficient updating unit 426 illustrated in FIG. 5 are indicated with the similar numerals.

As illustrated in FIG. 9, the distortion compensation coefficient updating unit 926 includes the multiplier 936_i,j and the inhibit coefficient determining unit 938. Based on the pre-distortion signal PD1(t) and the feedback signal Fb(t), the distortion compensation coefficient updating unit 926 calculates the update value corresponding to the distortion compensation coefficient h_i,j with respect to each LUT_i,j. That is, the distortion compensation coefficient updating unit 926 executes, by the circuit illustrated in FIG. 9, the calculating processing expressed in the following Formula 4. The first term of the following Formula 4 is different from the first term of the above-described Formula 2. However, the second term of Formula 4 is equivalent to Formula 2.

$$h\_i,j(|Tx(t-j)|) = \alpha(|Tx(t-j)|) \times h\_i,j(|Tx(t-j)|) + \mu\_i,j \times e(t) \times Fb^*(t-i)$$ [Formula 4]

The inhibit coefficient determining unit 938 receives the transmission signal Tx(t) input into the distortion compensation device 902 and also receives the transmission signal Tx(t−j) at the reference time t−j from the delay units (corresponding to the delay units 112_1 to 112_n−1 in FIG. 1) of the pre-distortion signal generating unit 424, respectively. The inhibit coefficient determining unit 938 determines the value of the inhibit coefficient $\alpha(|Tx(t-j)|)$ corresponding to each LUT_i,j as the function of the amplitude (absolute value) |Tx(t−j)| of the received transmission signal Tx(t−j). The inhibit coefficient $\alpha(|Tx(t-j)|)$ is a parameter of weighting corresponding to the distortion compensation coefficient. By adjusting the size of the first term to be corrected in the above-described Formula 4, the parameter prevents the update value(the left side in Formula 4) of the distortion compensation coefficient from increasing.

For example, depending on whether the amplitude (absolute value) |Tx(t−j)| of the transmission signal is larger than a threshold value Ath that is set in advance, the inhibit coefficient determining unit 938 changes the value of the inhibit coefficient as described below.

$$\alpha(|Tx(t-j)|) = \alpha_1 \text{ (in a case of } |Tx(t-j)| > A\text{th)}$$

$$\alpha(|Tx(t-j)|) = \alpha_2, \text{ where } \alpha_1 < \alpha_2 \text{ (in a case of } |Tx(t-j)| \leq A\text{th)}$$

At this time, if the value $\alpha_1$ in a case where the amplitude |Tx(t−j)| is larger than the threshold value Ath, the inhibit coefficient is set to be smaller than the value $\alpha_2$ in a case where the amplitude |Tx(t−j)| is equal to or smaller than the threshold value Ath.

If the amplitude |Tx(t−j)| of the transmission signal Tx(t−j) is small, the amplitude of the error signal e(t) and the complex conjugate feedback signal Fb*(t−i) is small as well. Thus, the amplitude (absolute value) of the error signal e is small. The second term of Formula 4 means a correction term for convergence of the distortion compensation coefficient, so that the convergence for converging the distortion compensation coefficients on an optimum value becomes weak.

If the amplitude of the transmission signal is small, the inhibit coefficient determining unit 938 increases the value of the inhibit coefficient to if the convergence of the distortion compensation coefficient is weak. Thus, in the first term of Formula 4, the amplitude of the distortion compensation coefficient is not excessively small by multiplying the inhibit coefficient. Therefore, regarding the distortion compensation coefficient h_i,j that is multiplied by the transmission signal Tx(t−j) with a smaller amplitude, the convergence speed for the optimum value may be improved.

The values of the inhibit coefficients $\alpha_1$ and $\alpha_2$ are properly set between 0 and 1, respectively. It is preferable that the values of the inhibit coefficients $\alpha_1$, $\alpha_2$ are determined in consideration with the memory effect characteristic of the power amplifier or the characteristic of increase or decrease of the distortion compensation coefficient in association with the updating processing ($0 \leq \alpha_1 < \alpha_2 \leq 1$).

The multiplier 936_i,j receives the distortion compensation coefficient h_i,j from the corresponding LUT_i,j inside the distortion compensation coefficient storage unit 422 and also receives the corresponding inhibit coefficient $\alpha(|Tx(t-j)|)$ from the inhibit coefficient determining unit 938.

The multiplier 936_i,j performs the weighting processing by multiplying the inhibit coefficient $\alpha(|Tx(t-j)|)$ by the distortion compensation coefficient h_i,j received by LUT_i,j and generates the signal T1_i,j corresponding to the first term of the above-described Formula 4. The multiplier 936_i,j supplies the generated signal T1_i,j to the adder ADD_i,j.

$$T1\_i,j = \alpha(|Tx(t-j)|) \times h\_i,j$$

The operations of the other parts of the distortion compensation device 902 illustrated in FIG. 9 are equivalent to the part corresponding to the distortion compensation device 402 illustrated in FIG. 4, so that the description is omitted.

As described above, in the distortion compensation coefficient updating unit 926 of the distortion compensation device 902, the inhibit coefficient corresponding to each LUT_i,j is set according to the amplitude (absolute value) |Tx(t−j)| of the corresponding transmission signal Tx(t−j). Due to this, the inhibit coefficient may be set to be an appropriate value according to the intensity of the convergence of the distortion compensation coefficient at the updating processing. Therefore, according to the intensity of the convergence at the updating processing, the distortion compensation device 902 may properly control the degree of weighting by the inhibit coefficient. Accordingly, the amplitude (absolute value) of the distortion compensation coefficient may be prevented from excessively increasing by suppressing the influence of the weighting processing on the convergence of the distortion compensation coefficient in the updating processing.

According to the above-described embodiments, for example, the set values $\alpha_1$ and $\alpha_2$ of the inhibit coefficients as the common value are set to each LUT_i,j. However, the embodiment is not limited to the example. For example, different set values of the inhibit coefficients may be set to each LUT_i,j. In the above-described embodiment, based on the size relation of the amplitude and the threshold value of the transmission signal, various values are allocated to the inhibit coefficient. However, the embodiment is not limited to the example. For example, different values are allocated as the inhibit coefficient to each value of the amplitude |Tx(t−j)| of the transmission signal.

[3-2. Example of Update Operation of Distortion Compensation Coefficient in Distortion Compensation Device 902]

Figure 10:
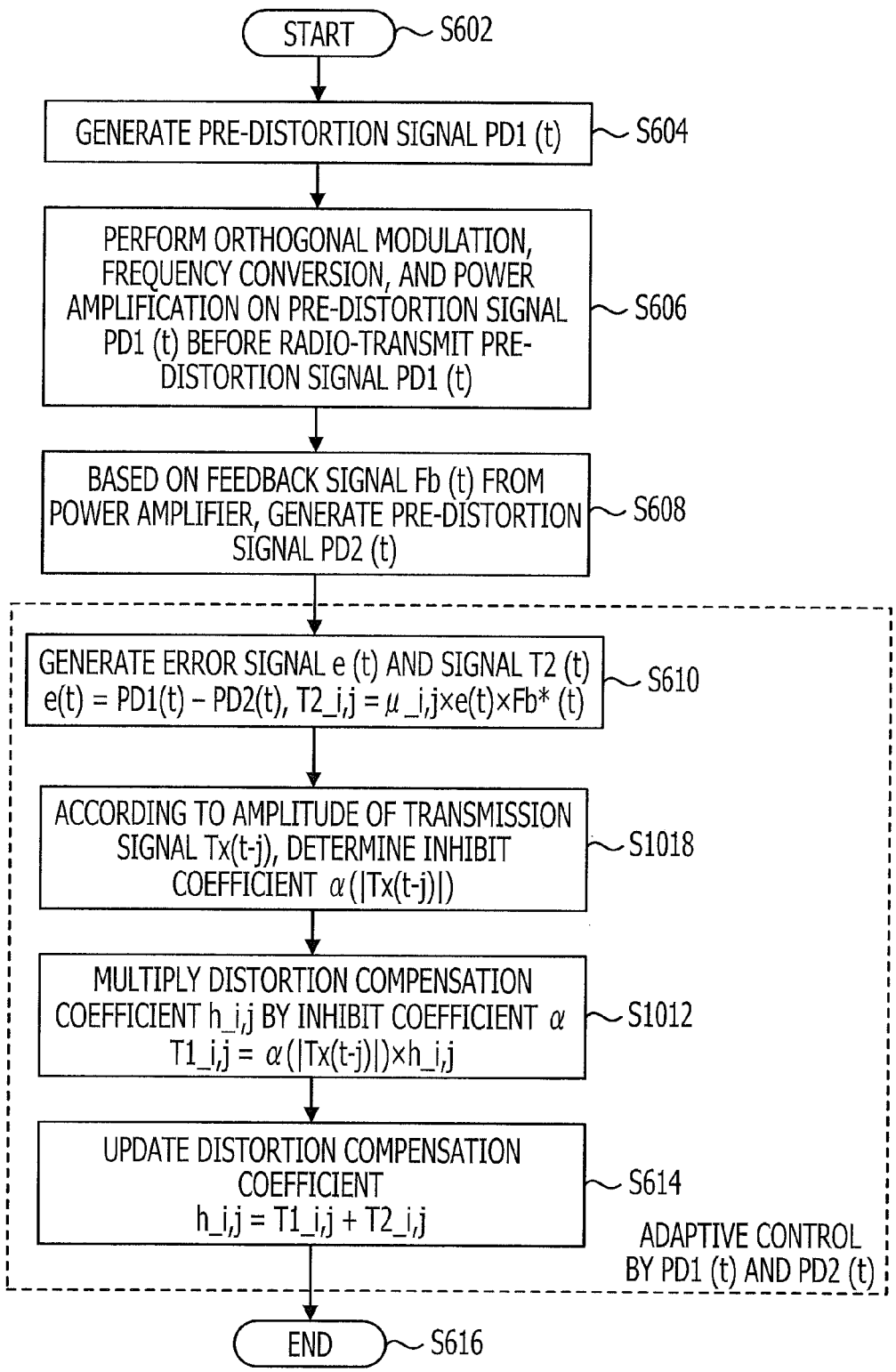
FIG. 10 is a diagram of an example of a flowchart of the updating processing of the distortion compensation coefficient in a distortion compensation device 902.

FIG. 10 is a diagram illustrating an example of a flowchart of the updating processing of the distortion compensation coefficient in the distortion compensation device 902.

The flowchart illustrated in FIG. 10 is different from the flowchart illustrated in FIG. 6 in that the flowchart illustrated in FIG. 10 has Operation S1012 instead of Operation S612 and adds Operation S1018. However, the other parts of the flowchart illustrated in FIG. 10 are equivalent to the flowchart illustrated in FIG. 6. In FIG. 10, the parts that are equivalent to or correspond to the flowchart illustrated in FIG. 6 are indicated with the similar numerals. With reference to the flowchart illustrated in FIG. 10, the updating processing will be described below.

Operations S602 to S610 are equivalent to the processing explained in the flowchart illustrated in FIG. 6, so that the description is omitted.

In Operation S1018, the inhibit coefficient determining unit 938 determines the value of the inhibit coefficient $\alpha(|Tx(t-j)|)$ as a function of the amplitude (absolute value) $|Tx(t-j)|$ of the transmission signal $Tx(t-j)$. For example, if the amplitude (absolute value) $|Tx(t-j)|$ of the transmission signals larger than the threshold value Ath that is set in advance, the inhibit coefficient determining unit 938 sets the value $\alpha_1$ as the value of the inhibit coefficient. If $|Tx(t-j)|$ is equal to or smaller than the threshold value Ath, the inhibit coefficient determining unit 938 sets the value $\alpha_2$ that is larger than the value $\alpha_1$.

In Operation S1012, the distortion compensation coefficient updating unit 926 receives the distortion compensation coefficient h_i,j and performs the weighting processing by multiplying the inhibit coefficient $\alpha(|Tx(t-j)|)$ by the received distortion compensation coefficient h_i,j. By the weighting processing, the distortion compensation coefficient updating unit 926 generates the signal T1_i,j corresponding to the first term of the update formula of the distortion compensation coefficient illustrated in Formula 4.

Operations S614 and S616 are equivalent to the processing explained in the flowchart illustrated in FIG. 6, so that the description is omitted.

In Operations S610, S1018, S1012, and S614, the distortion compensation coefficient updating unit 926 performs the adaptive control processing with the pre-distortion signal PD1(t) and the pre-distortion signal PD2(t).

As described above, in the distortion compensation device 902, the inhibit coefficient corresponding to each LUT_i,j is set according to the amplitude (absolute value) $|Tx(t-j)|$ of the corresponding transmission signal $Tx(t-j)$ in Operation S1018, the inhibit coefficient may be set to be an appropriate value according to the intensity of the convergence of the distortion compensation coefficient at the updating processing. Therefore, in Operation S1012, since the degree of weighting by the inhibit coefficient may be properly controlled according to the convergence of the distortion compensation coefficient at the updating processing, the distortion compensation device 902 may prevent the amplitude (absolute value) of the distortion compensation coefficient from excessively increasing while suppressing the influence of the weighting processing on the convergence of the distortion compensation coefficient in the updating processing.

The above-described embodiments describes the example in which the distortion compensation device 902 performs the adaptive control processing in Operations S610, S1018, S1012, and S614 by the distortion compensation coefficient updating unit 926 using the hardware. However, the embodiment is not limited to the example. For example, a predetermined processor is provided in the distortion compensation device 902, and the processing illustrated in Operations S610, S1018, S1012, and S614 may be executed by the program.

4. Fourth Embodiment

A radio communication device and a distortion compensation device according to a fourth embodiment will be described below.

[4-1. Description Example of Distortion Compensation Coefficient Updating Unit 1126]

The configuration of the radio communication device 1100 according to the fourth embodiment is different from the configuration of the radio communication device 400 illustrated in FIG. 4 in that the configuration of the radio communication device 1100 includes a distortion compensation device 1102 and a distortion compensation coefficient updating unit 1126 instead of the distortion compensation device 402 and the distortion compensation coefficient updating unit 426. However, the other parts of the radio communication device 1100 are equivalent to the radio communication device 400. Therefore, the illustration of the configuration of the radio communication device 1100 is omitted.

Figure 11:
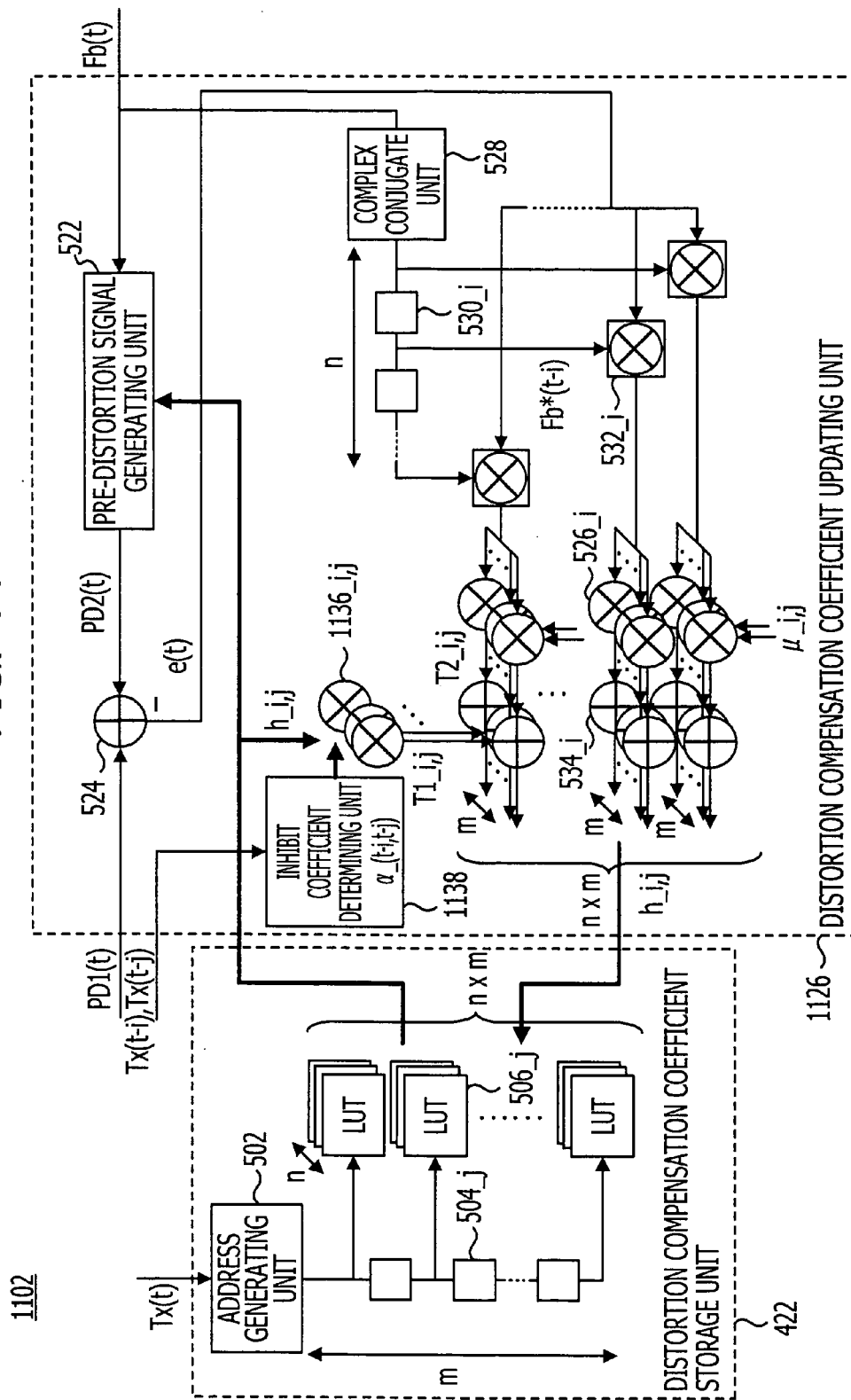
FIG. 11 is a diagram of an example of an internal configuration of a distortion compensation coefficient updating unit 1126.

FIG. 11 is a diagram illustrating an example of an internal configuration of the distortion compensation coefficient updating unit 1126. The internal configuration of the distortion compensation coefficient updating unit 1126 is different from the internal configuration of the distortion compensation coefficient updating unit 426 illustrated in FIG. 5 in that the internal configuration of the distortion compensation coefficient updating unit 1126 includes a multiplier 1136_i,j and an inhibit coefficient determining unit 1138 instead of the multiplier 536_i,j. However, the other parts of the distortion compensation coefficient updating unit 1126 are equivalent to the distortion compensation coefficient updating unit 426. In FIG. 11, the parts that are equivalent to or correspond to the distortion compensation coefficient updating unit 426 illustrated in FIG. 5 are indicated with the similar numerals.

As illustrated in FIG. 11, the distortion compensation coefficient updating unit 1126 includes the multiplier 1136_i,j and the inhibit coefficient determining unit 1138. Based on the pre-distortion signal PD1(t) and the feedback signal Fb(t), the distortion compensation coefficient updating unit 1126 calculates the update value corresponding to the distortion compensation coefficient h_i,j with respect to each LUT_i,j. That is, by a circuit illustrated in FIG. 11, the distortion compensation coefficient updating unit 1126 executes the calculating processing expressed in the following Formula 5. The first term of the following Formula 5 is different from the first term of Formula 2. The second term of Formula 5 is equivalent to the second term of Formula 2.

$$h\_i,j(|Tx(t-j)|) = \alpha\_i,j(t-i,t-j) \times h\_i,j(|Tx(t-j)|) + \mu\_i,j \times e(t) \times Fb^*(t-i)$$ [Formula 5]

The inhibit coefficient determining unit 1138 receives the transmission signal Tx(t) input into the distortion compensation device 1102 and also receives the transmission signal Tx(t−j) at the reference time t−j from each of the delay units (corresponding to delay units 112_1 to 112_n−1) of the pre-distortion signal generating unit 424. The inhibit coefficient determining unit 1138 determines the value of the inhibit coefficient $\alpha\_i,j(t-i,t-j)$ corresponding to each LUT_i,j depending on whether the correlation of the transmission signals Tx(t−i) and Tx(t−j) is higher than a level that is set in advance.

The inhibit coefficient $\alpha\_i,j(t-i,t-j)$ is a parameter of weighting corresponding to the distortion compensation coefficient. The parameter inhibits the increase of the update value (the left side of Formula 5) of the distortion compensation coefficient by adjusting the size of the first term to be corrected in the above-described Formula 5.

For example, based on the evaluation function Ev_i,j(t−i, t−j) (hereinafter referred to as Ev_i,j) expressed in the following Formula 6, the inhibit coefficient determining unit 1138 determines the value of the inhibit coefficient α_i,j(t−i,t−j) corresponding to each LUT_i,j by evaluating the intensity of the correlation of the corresponding transmission signals Tx(t−i) and Tx(t−j). The evaluation function Ev_i,j means that the correlation of the corresponding transmission signals Tx(t−i) and Tx(t−j) become stronger if the value gets closer to 1.

$$EV\_i, j(t-i, t-j) = \frac{Tx(t-i)}{Tx(t-j)} \quad \text{[Formula 6]}$$
$$= \frac{Tx(t-i) \times Tx^*(t-j)}{|Tx(t-j)|^2}$$

Depending on whether the value of an evaluation function Ev_i,j is within a range that is closer to 1 set in advance, determined by the threshold value Evth, the inhibit coefficient determining unit 1138 changes the value of the inhibit coefficient as described below.

α_i,j(t−i,t−j)=α$_1$ (in a case of ||Ev_i,j|−1|<Evth)

α_i,j(t−i,t−j)=α$_2$, where α$_1$<α$_2$ (in a case of ||Ev_i,j|−1|≥Evth)

At this time, the inhibit coefficient is set in such a way that the value α$_1$ obtained when a value within the range where the value of Ev_i,j is closer to 1 set in advance is smaller than the value α$_2$ as a value obtained when the value is not within the range where the value of Ev_i,j is closer to 1 set in advance.

The values of the inhibit coefficients α$_1$ and α$_2$ are properly set between 0 and 1, respectively. It is preferable that the values of the inhibit coefficients α$_1$, α$_2$ are determined in consideration of the characteristicy of increase or decrease of the distortion compensation coefficient in association with the updating processing (0≤α$_1$<α$_2$≤1).

In general, if the signal band per carrier is narrow, the amplitudes of the transmission signals Tx(t−i), Tx(t−j) with adjacent values i and j, so that the signals are similar to each other. In this case, according to the distortion compensating processing, the influence of the plurality of transmission signals that is similar to each other is taken. As a result, the delay term (correction component of the distortion compensating processing) corresponding to the adjacent transmission signals Tx(t−i) and Tx(t−j) performs the excessive correction on the distortion compensating processing and intends to cause deterioration of the convergence of the distortion compensation coefficient. Therefore, if the values of the amplitude of the transmission signals Tx(t−i) and Tx(t−j) are close to each other, the value of the inhibit coefficient is smaller compared to the value of which the amplitudes of the transmission signals are different from each other. In this manner, according to the first term of Formula 5, the distortion compensation coefficient after being multiplied by the inhibit coefficient is not relatively large by reducing the value of the inhibit coefficient. That is, thinning processing is performed on the distortion compensation coefficient h_i,j. This may reduce the degree of the influence of the delay term (correction component of the distortion compensating processing) that may perform excessive correction in the distortion compensating processing.

The multiplier 1136_i,j receives the distortion compensation coefficient h_i,j from the corresponding LUT_i,j inside the distortion compensation coefficient storage unit 422 and also receives the corresponding inhibit coefficient α_i,j(t−i, t−j) from the inhibit coefficient determining unit 1138.

By performing the weighting processing by multiplying the distortion compensation coefficient h_i,j by the inhibit coefficient α_i,j(t−i,t−j) received from LUT_i,j, the multiplier 1136_i,j generates the signal T_i,j corresponding to the first term of the above-described Formula 5. The multiplier 1136_i,j supplies the generated signal T1_i,j to the corresponding adder ADD_i,j.

$$T1\_i,j = α\_i,j(t-i,t-j) \times h\_i,j$$

The operation of the other parts of the distortion compensation device 1102 illustrated in FIG. 11 is equivalent to the part corresponding to the distortion compensation device 402 illustrated in FIG. 4, so that the description is omitted.

As described above, in the distortion compensation coefficient updating unit 1126 of the distortion compensation device 1102, the inhibit coefficient corresponding to each LUT_i,j is set based on the correlation of the corresponding transmission signals Tx(t−i) and Tx(t−j). Thus, by setting the inhibit coefficient to the optimum value, the degree of the influence on the distortion compensating processing of the corresponding delay term (correction component of the distortion compensating processing). Therefore, even if the signal band of a carrier is narrow and if the amplitude of the transmission signal to be input into the distortion compensation device 1102 includes many signals of which the values of the amplitudes are close to each other, the distortion compensation device 1102 may prevent the amplitude (absolute value) of the distortion compensation coefficient from excessively increasing while improving the convergence of the distortion compensation coefficient in the updating processing.

According to the above-described embodiment, for example, the common set values α$_1$ and α$_2$ of the inhibit coefficient are set to each LUT_i,j. However, the embodiment is not limited to the example. For example, set values of the inhibit coefficient may be set individually to each LUT_i,j. As explained in the second embodiment, the inhibit coefficients α$_1$ and α$_2$ may be set to have smaller values as the value of i or j of the corresponding LUT_i,j gets larger.

[4-2. Example of Update Operation of Distortion Compensation Coefficient in Distortion Compensation Device 1102]

Figure 12:
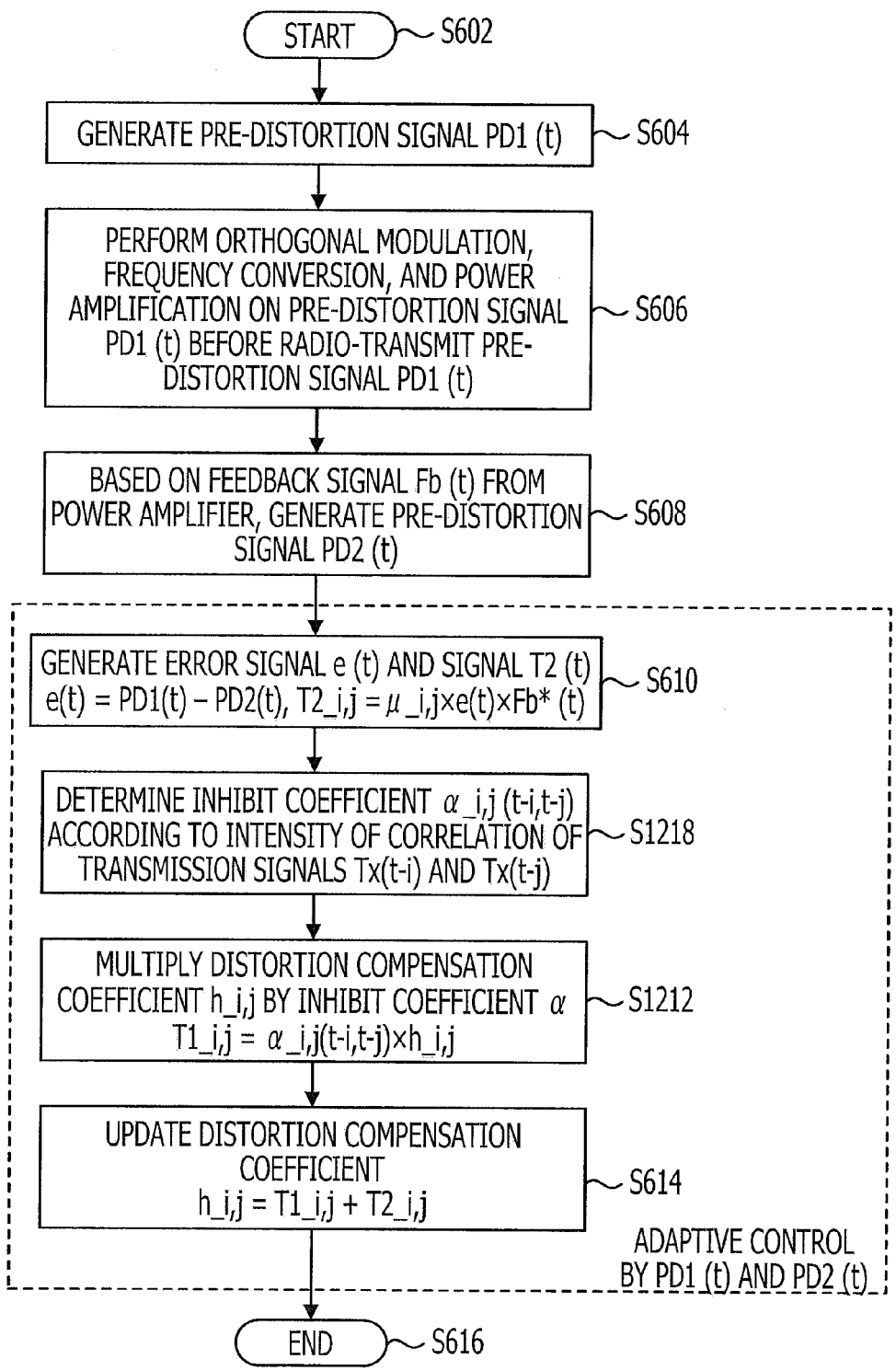
FIG. 12 is a diagram of an example of a flowchart of the updating processing of the distortion compensation coefficient in a distortion compensation device 1102.

FIG. 12 is a diagram illustrating an example of a flowchart of the updating processing of the distortion compensation coefficient in the distortion compensation device 1102.

The flowchart illustrated in FIG. 12 is different from the flowchart illustrated in FIG. 6 in that the flowchart illustrated in FIG. 12 includes Operation S1212 instead of Operation S612 and adds Operations S1218. However, the other parts of the flowchart illustrated in FIG. 12 are equivalent to the flowchart illustrated in FIG. 6. In FIG. 12, the parts that are equivalent to or correspond to the flowchart illustrated in FIG. 6 are indicated with the similar numerals. With reference to the flowchart illustrated in FIG. 12, the updating processing of the distortion compensation coefficient will be described.

Operations S602 to S610 are equivalent to the processing explained in the flowchart illustrated in FIG. 6, so that the description is omitted.

In Operation S1218, the inhibit coefficient determining unit 1138 determines the value of the inhibit coefficient α_i, j(t−i,t−j) based on the correlation of the corresponding transmission signals Tx(t−i) and Tx(t−j). The inhibit coefficient determining unit 1138 sets the value α$_1$ if the value of the above-described evaluation function Ev_i,j, as the value of the inhibit coefficient, is the value within the range that is close to 1 set in advance.

In Operation S1212, the distortion compensation coefficient updating unit 1126 receives the distortion compensation coefficient h_i,j from each LUT_i,j and performs the weighting processing by multiplying the inhibit coefficient α_i,j(t−i,t−j) by the received distortion compensation coefficient h_i,j. By performing the weighting processing, the distortion compensation coefficient updating unit 1126 generates the signal T1_i,j corresponding to the first term of the update formula of the distortion compensation coefficient illustrated in Formula 5.

Operations S614 and S616 are equivalent to the processing explained in the flowchart illustrated in FIG. 6, so that the description is omitted.

In the above-described Operations S610, S1218, S1212, and S614, the distortion compensation coefficient updating unit 1126 performs the adaptive control processing with the pre-distortion signals PD1(t) and PD2(t).

As described above, in Operation S1218, the distortion compensation device 1102 sets the inhibit coefficient corresponding to each LUT_i,j based on the correlation of the corresponding transmission signals Tx(t−i) and Tx(t−j). The degree of the influence on the distortion compensating processing of the corresponding delay term (correction component of the distortion compensating processing) may be adjusted by setting the inhibit coefficient to an appropriate value. Therefore, even if the signal band of a carrier is narrow and if the transmission signals that are to be input into the distortion compensation device 1102 includes signals of which the amplitudes are close to each other are included, the distortion compensation device 1102 may prevent the amplitude (absolute value) of the distortion compensation coefficient from excessively increasing while improving the convergence of the distortion compensation in the updating processing.

In the above-described embodiments, for example, the distortion compensation device 1102 performs the adaptive control processing of Operations S610, S1218, S1212, and S614 by using the hardware by the distortion compensation coefficient updating unit 1126. However, the embodiment is not limited to the example. For example, a predetermined processor may be provided in the distortion compensation device 1102, and the processor may execute the processing illustrated in Operations S610, S1218, S1212, and S614 by the programs.

5. Fifth Embodiment

A radio communication device and a distortion compensation device according to a fifth embodiment will be described below.

[5-1. Configuration Example of Distortion Compensation Coefficient Updating Unit 1126]

The configuration of the radio communication device 1300 according to the fifth embodiment is different from the configuration of the radio communication device 400 illustrated in FIG. 4 in that the configuration of the radio communication device 1300 includes a distortion compensation device 1302 and a distortion compensation coefficient updating unit 1326 instead of the distortion compensation device 402 and the distortion compensation coefficient updating unit 426. However, the other parts of the radio communication device 1300 are equivalent to the radio communication device 400. The illustration of the configuration of the radio communication device 1300 is omitted.

Figure 13:
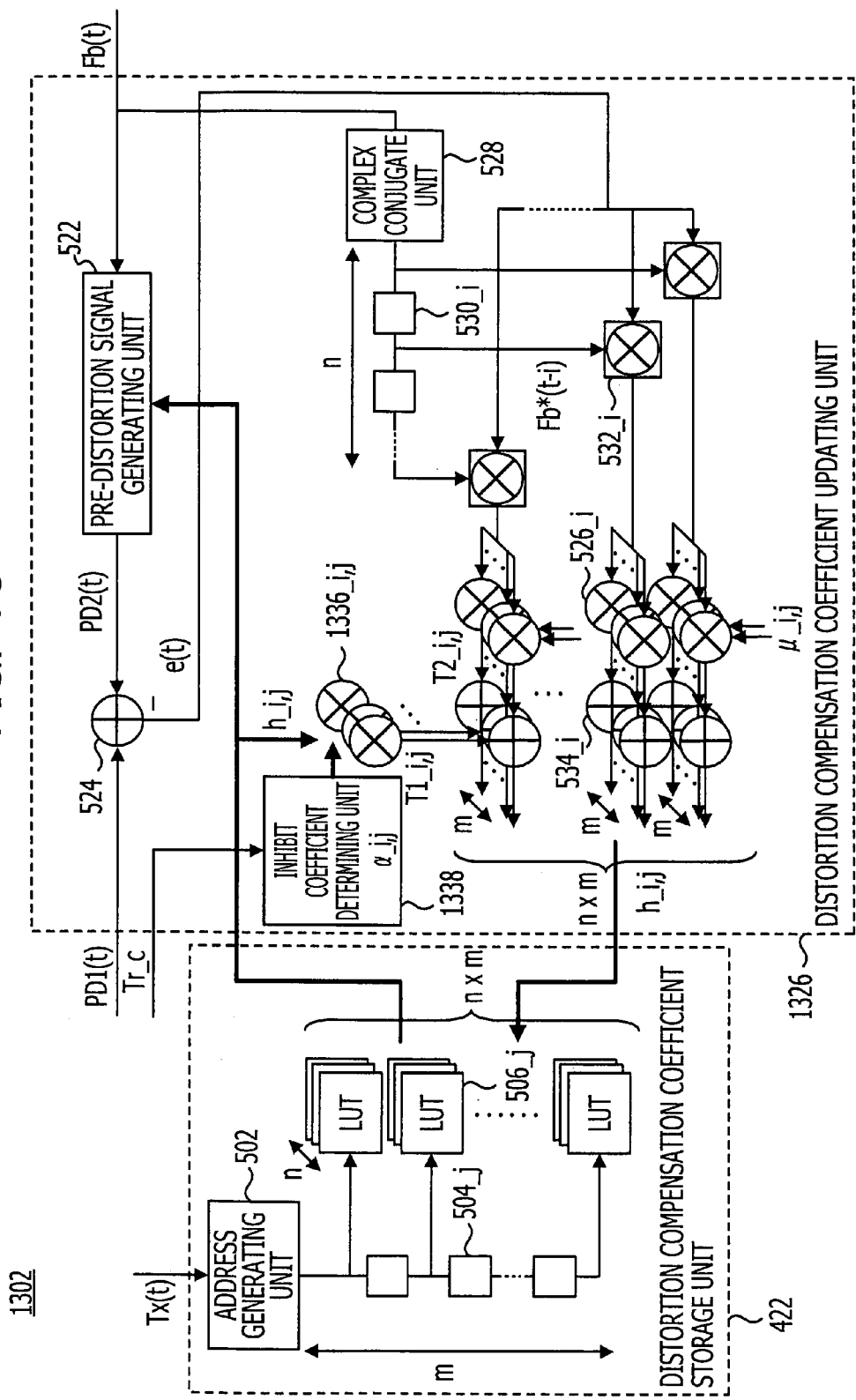
FIG. 13 is a diagram illustrating an example of an internal configuration of a distortion compensation coefficient updating unit 1326.

FIG. 13 is a diagram illustrating an internal configuration of the distortion compensation coefficient updating unit 1326. The internal configuration of the distortion compensation coefficient updating unit 1326 is different from the internal configuration of the distortion compensation coefficient updating unit 426 illustrated in FIG. 5 in that the internal configuration of the distortion compensation coefficient updating unit 1326 includes the multiplier 1336_i,j and the inhibit coefficient determining unit 1338 instead of the multiplier 536_i,j. However, the other parts of the distortion compensation coefficient updating unit 1326 are equivalent to the distortion compensation coefficient updating unit 426. In FIG. 13, the parts that are equivalent to or correspond to the distortion compensation coefficient updating unit 426 illustrated in FIG. 5 are indicated with the similar numerals.

As illustrated in FIG. 13, the distortion compensation coefficient updating unit 1326 includes the multiplier 1336_i,j and the inhibit coefficient determining unit 1338. Based on the pre-distortion signal PD1(t) and the feedback signal Fb(t), the distortion compensation coefficient updating unit 1326 calculates the update value corresponding to the distortion compensation coefficient h_i,j with respect to each LUT_i,j. That is, the distortion compensation coefficient updating unit 1326 executes, by the circuit illustrated in FIG. 13, the calculating processing illustrated in FIG. 7. The first term of the following Formula 7 is different from the first term of the above-described Formula 2. However, the second term of Formula 7 is equivalent to Formula 2.

$$h\_i,j(|Tx(t-j)|) = \alpha\_i,j \times h\_i,j(|Tx(t-j)|) + \mu\_i,j \times e(t) \times Fb^*(t-i)$$ [Formula 7]

The radio communication device 1300 batch-transmits a plurality of transmission signals by a plurality of carriers. Therefore, the plurality of transmission signals carried by the plurality of carriers with continuous signal bands are collectively input into the radio communication device 1300.

The number of carriers corresponding to a plurality of transmission signals and transmission carrier information Tr_c that includes information indicating the value of transmission power of each carrier are input, from the transmission signal generation device that is not illustrated, into the distortion compensation device 1302 of the radio communication device 1300 illustrated in FIG. 13.

The inhibit coefficient determining unit 1338 receives transmission carrier information Tr_c that is input into the distortion compensation device 1302. The inhibit coefficient determining unit 1338 determines the value of the inhibit coefficient α_i,j corresponding to each LUT_i,j based on the number of the carriers and the transmission power value of each of the carriers illustrated in the received transmission carrier information Tr_c. For example, the inhibit coefficient determining unit 1338 determines an apparent signal bandwidth based on the number of the carriers and the transmission power value of each carrier, and determines the value of the inhibit coefficient α_i,j based on the determined apparent signal bandwidth.

The inhibit coefficient α_i,j is a parameter of weighting corresponding to the distortion compensation coefficient prevents the update value of the distortion compensation coefficient (the left side of Formula 7) by adjusting the size of the first term to be corrected in the above-described Formula 7.

FIG. 14 is a diagram illustrating a determining method of a signal bandwidth of a plurality of carriers in the inhibit coefficient determining unit 1338. The inhibit coefficient determining unit 1338 determines whether or not the apparent signal bandwidth of the plurality of carriers that carries a plurality of transmission signals, that is, the signal band of the plurality of carriers is considered as an apparent single wide band.

Figure 14A:
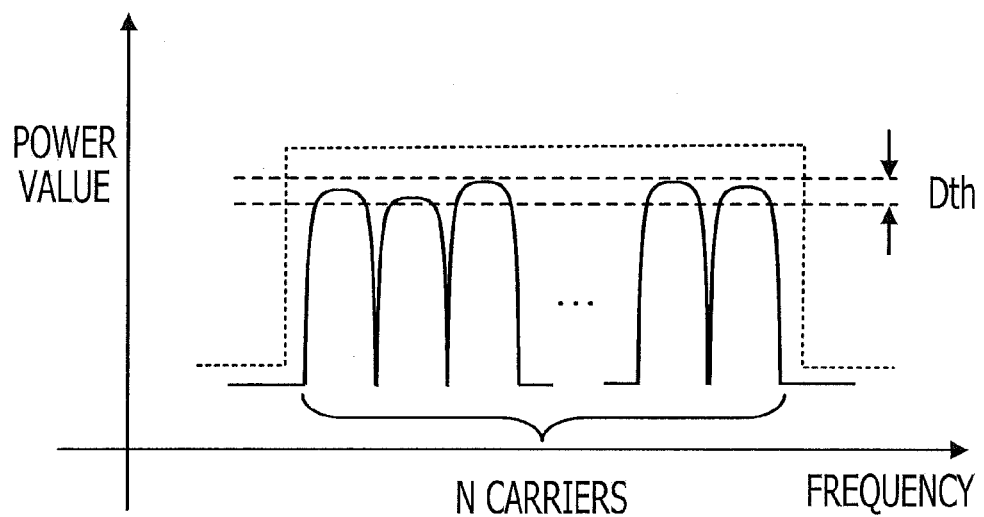
FIG. 14A and FIG. 14B are diagrams illustrating a determining method of a signal bandwidth of a plurality of carries in an inhibit coefficient determining unit 1338.
Figure 14B:
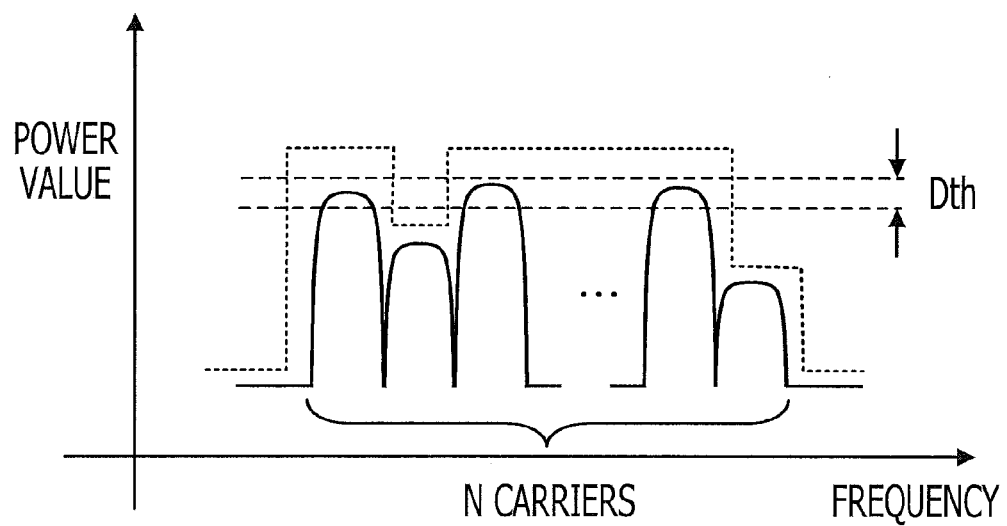

As illustrated in FIG. 14A, if the difference between the transmission power values among a plurality of carriers is within the range of a threshold value Dth that is set in advance, the apparent signal bandwidth of the plurality of carriers is wide, so that the signal band of the plurality of carriers may be considered as an apparent single wide band. On the other hand, as illustrated in FIG. 14B, the inhibit coefficient determining unit 1338 determines that the apparent signal bandwidth of the plurality of carriers is narrow and that the signal band of the plurality of carriers is a set of the narrow bands If the inhibit coefficient determining unit 1338 determines that the signal band of the plurality of carriers is an apparent single wide band, for example, the inhibit coefficient $\alpha\_i,j$ is set to be a smaller value as the value i or j of the corresponding LUT_i,j gets larger. The setting of the inhibit coefficient $\alpha\_i,j$ in this case is equivalent to the second embodiment. The value of the inhibit coefficient $\alpha\_i,j$ may be common to each LUT_i,j.

On the other hand, if the inhibit coefficient determining unit 1338 determines that the signal band of the plurality of carriers is an assembly of narrow bands, the inhibit coefficient $\alpha\_i,j$ is set to be a small value as the value of i or j of the corresponding LUT_i,j gets larger. At this time, a certain value of coefficient is set to be smaller than the value of the coefficient with the value of i or j. That is, the inhibit coefficient determining unit 1338 performs the thinning processing on the distortion compensation coefficient h_i,j of the LUT_i, j.

As described in the fifth embodiment, in general, if the signal band of a carrier is a narrow band, the adjacent transmission signals (the values of i,j are adjacent to each other) tend to become similar to each other. Therefore, according to the distortion compensating processing, the influence of the plurality of transmission signals that is similar to each other is taken. As a result, the delay term (correction component of the distortion compensating processing) corresponding to the transmission signals performs the excessive correction on the distortion compensating processing and intends to cause deterioration of the convergence of the distortion compensation coefficient. Therefore, regarding the inhibit coefficient $\alpha\_i,j$ corresponding to the delay term, the coefficient value is set to be small.

The values of the inhibit coefficient $\alpha\_i,j$ are properly set between 0 and 1, respectively. It is preferable that the values of the inhibit coefficient $\alpha\_i,j$ are determined in consideration with the memory effect characteristic of the power amplifier or the characteristic of increase or decrease of the distortion compensation coefficient in association with the updating processing ($0 \leq \alpha\_i,j \leq 1$).

The multiplier 1336_i,j receives the distortion compensation coefficient h_i,j from the corresponding LUT_i,j inside the distortion compensation coefficient storage unit 422 and also receives the corresponding inhibit coefficient $\alpha\_i,j$ from the inhibit coefficient determining unit 1338. The inhibit coefficient $\alpha\_i,j$ is prepared as a table inside the inhibit coefficient determining unit 1338 and is stored in a storage device (not illustrated) such as a RAM.

The multiplier 1336_i,j performs the weighting processing by multiplying the distortion compensation coefficient h_i,j received from LUT_i,j by the inhibit coefficient $\alpha\_i,j$ to generate the signal T1_i,j corresponding to the first term of the above-described Formula 7. The multiplier 1336_i,j supplies the generated signal T1_i,j to the adder ADD_i,j.

The operations of the other parts of the distortion compensation device 1302 illustrated in FIG. 13 are equivalent to the part corresponding to the distortion compensation device 402 illustrated in FIG. 4, so that the description is omitted.

As described above, the distortion compensation coefficient updating unit 1326 of the distortion compensation device 1302 sets the inhibit coefficient corresponding to each LUT_i,j based on the number of carriers and the transmission power value of each carrier included in the transmission carrier information Tr_c. Therefore, the value of the inhibit coefficient may be set according to an apparent state (variations of the transmission power value of each carrier) of the signal band of a plurality of carriers carrying a plurality of transmission signals. Therefore, even if the plurality of transmission signals is collectively transmitted, the distortion compensation device 1302 may prevent the amplitude (absolute value) of the distortion compensation coefficient from excessively increasing while improving the convergence of the distortion compensation coefficient in the updating processing.

[5-2. Example of Update Operation of Distortion Compensation Coefficient in Distortion Compensation Device 1302]

FIG. 15 is a diagram illustrating an example of a flowchart of updating processing of a distortion compensation coefficient in the distortion compensation device 1302.

The flowchart illustrated in FIG. 15 is different from the flowchart illustrated in FIG. 6 in that the flowchart illustrated in FIG. 15 includes Operation S1512 instead of Operation S612 and adds Operations S1518 to S1524. However, the other parts of the flowchart illustrated in FIG. 15 are equivalent to the flowchart illustrated in FIG. 6. In FIG. 15, the parts that are equivalent or correspond to the flowchart illustrated in FIG. 6 are indicated with the similar numerals. With reference to the flowchart illustrated in FIG. 15, the updating processing of the distortion compensation coefficient will be described below.

Regarding Operations S602 to S610, the processing is equivalent to the processing described in the flowchart illustrated in FIG. 6, so that the description is omitted.

In Operation S1518, the inhibit coefficient determining unit 1338 acquires data of the number of carriers of the transmission signals based on the transmission carrier information Tr_c input from the transmission signal generation device that is not illustrated.

In Operation S1520, based on the transmission carrier information Tr_c, the inhibit coefficient determining unit 1338 acquires the data of the transmission power value of each of the carriers.

In Operation S1522, based on the data of the number of carriers acquired in Operation S1518 and on the transmission power value data acquired in Operation S1522, the inhibit coefficient determining unit 1338 determines an apparent signal bandwidth of the plurality of carriers.

For example, if the difference of the transmission power values among the plurality of carriers is within the range of the threshold value set in advance, the inhibit coefficient determining unit 1338 determines that the apparent signal bandwidth of the plurality of carriers is wide. Regarding at least one of the plurality of carriers, the apparent signal bandwidth of the plurality of carriers is narrow if the difference between the transmission power value of the carrier and the transmission power value of another carrier.

In Operation S1524, based on the apparent signal bandwidth of the plurality of carriers determined in Operation S1522, the inhibit coefficient determining unit 1338 determines the inhibit coefficient $\alpha\_i,j$. The inhibit coefficient $\alpha\_i,j$ is set as described above.

In Operation S1512, the distortion compensation coefficient updating unit 1326 receives the distortion compensation coefficient h_i,j from each LUT_i,j and performs the weighting processing by multiplying the received distortion compensation coefficient h_i,j by the inhibit coefficient α_i,j. By the weighting processing, the distortion compensation coefficient updating unit 1326 generates the signal T1_i,j corresponding to the first term of the update formula of the distortion compensation coefficient expressed in Formula 7.

Operations S614 and S616 are equivalent to the processing described in the flowchart illustrated in FIG. 6, so that the description is omitted.

In Operations S610, S1518 to S1524, S1512, and S614, the distortion compensation coefficient updating unit 1326 performs the adaptive control processing with the pre-distortion signals PD1(t) and PD2(t).

As described above, the distortion compensation device 1302 sets the inhibit coefficient corresponding to each LUT_i,j based on the number of carriers and on the transmission power value for each carrier included in the transmission carrier information Tr_c. The value of the inhibit coefficient may be set according to an apparent state (various transmission power values of the carriers or the like) of the signal band of the plurality of carriers carrying the plurality of transmission signals. Therefore, in Operation S1512, even if the plurality of transmission signals is collectively transmitted, the distortion compensation device 1302 may prevent the amplitude (absolute value of the distortion compensation coefficient from excessively increasing while improving the convergence of the distortion compensation coefficient in the updating processing.

According to the above-described embodiment, the distortion compensation device 1302 performs the adaptive control processing of Operations S610, S1518 to S1524, S1512, and S614 by the distortion compensation coefficient updating unit 1326 using the hardware. For example, a predetermined processor is provided in the distortion compensation device 1302, and the processing illustrated in S610, S1518 to S1524, S1512, and S614 may be executed by the programs of the processor.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A distortion compensation device which reduces a distortion of an amplifier which is added to an output signal of the amplifier, the distortion compensation device comprising:
 a plurality of distortion compensation coefficient storage circuits which stores a plurality of distortion compensation coefficients and outputs the distortion compensation coefficients according to an amplitude of an input signal of the amplifier;
 a distortion compensating processing circuit which adds the distortion compensation coefficient output from each of the plurality of distortion compensation coefficient storage circuits to the input signal of the amplifier; and
 a distortion compensation coefficient updating circuit which performs weighting processing on the distortion compensation coefficient output from each of the plurality of distortion compensation coefficient storage circuits to reduce the distortion compensation coefficient and which calculates an update value of the distortion compensation coefficient by using the distortion compensation coefficient which is subjected to the weighting processing.

2. The distortion compensation device according to claim 1, wherein the distortion compensation coefficient updating circuit performs different weighting processing on the distortion compensation coefficient according to the distortion compensation coefficient storage circuits, respectively.

3. The distortion compensation device according to claim 2, wherein each of the plurality of distortion compensation coefficient storage circuits is associated with a combination of a plurality of signals selected from a signal group having the input signal of the amplifier and a plurality of delay signals with various delay amounts of the input signal of the amplifier, and
 wherein the distortion compensation coefficient updating circuit reduces weighting of the weighting processing as the delay amount with respect to the input signal of the amplifier of the plurality of signals selected according to the combination.

4. The distortion compensation device according to claim 1, wherein the distortion compensation coefficient updating circuit performs the different weighting processing on the distortion compensation coefficient according to the amplitude of the input signal of the amplifier.

5. The distortion compensation device according to claim 4, wherein the distortion compensation coefficient updating circuit increase the weighting of the weighting processing so that the weighing in a case where the amplitude of the input signal of the amplifier is smaller than a predetermined threshold value is larger than the weighting in a case where the amplitude of the input signal of the amplifier is larger than the predetermined threshold value.

6. The distortion compensation device according to claim 1, wherein the plurality of distortion compensation coefficient storage circuits is associated with the combination of the plurality of signals selected from the signal group having the input signal of the amplifier and the plurality of delay signals with various delay amounts of the input signal of the amplifier,
 wherein the distortion compensation coefficient updating circuit evaluates a correlation between the plurality of signals selected according to the combination, and
 wherein the distortion compensation device performs the weighing processing on the distortion compensation coefficient, which is output from the distortion compensation coefficient storage circuit associated with the combination, according to the evaluated correlation between the signals.

7. The distortion compensation device according to claim 6, wherein the distortion compensation coefficient updating circuit evaluates the correlation between two signals by evaluating a proximity of the two signals, and
 wherein the distortion compensation device performs the weighting processing in such a way that the weighting in a case where the evaluated correlation between the signals is stronger than a predetermined level is smaller than the weighting in a case where the evaluated correlation between the signals is weaker than the predetermined level.

8. The distortion compensation device according to claim 1, wherein a plurality of carriers inputs the input signal transmitted from the amplifier is input and a piece of transmission carrier information indicating a transmission power value of the input signal of the amplifier of each of the carriers is input into the distortion compensation device, and wherein the distortion compensation coefficient updating circuit changes the weighting of the weighting processing regarding the distortion compensation coefficient based on the transmission carrier information.

9. The distortion compensation device according to claim 8, wherein the distortion compensation coefficient updating circuit determines an apparent signal bandwidth of the plurality of carriers based on a transmission power value of an input signal of the amplifier for each carrier indicated by the transmission carrier information, and wherein the distortion compensation coefficient updating circuit changes the weighting of the weighting processing regarding the distortion compensation coefficient based on the determined signal bandwidth.

10. The distortion compensation device according to claim 1, wherein the distortion compensation updating circuit calculates a difference between the signal obtained by adding the distortion compensation coefficient read out from the distortion compensation coefficient storage circuit to a feedback signal as the output signal of the amplifier and the output signal of the distortion compensating processing circuit, and wherein the distortion compensation updating circuit calculates the update value of the distortion compensation coefficient based on the distortion compensation coefficient subjected to the weighing processing to conjugate the error and updates the distortion compensation coefficient of the distortion compensation coefficient storage circuit by the update value.

11. A distortion compensating method for reducing a distortion of an amplifier added to an output signal of the amplifier, the distortion compensating method comprising:

reading out the distortion compensation coefficient according to an amplitude of a transmission signal from a plurality of distortion compensation units in which a plurality of distortion compensation coefficients is stored;

adding the distortion compensation coefficients which are read out from the plurality of distortion compensation coefficient storage units to an input signal of the amplifier;

performing weighting processing on the distortion compensation coefficient read out from the plurality of distortion compensation coefficient storage units to reduce the distortion compensation coefficient; and calculating the update value of the distortion compensation coefficient by using the distortion compensation coefficient which is subjected to the weighting processing.

12. The distortion compensation device according to claim 1, wherein the distortion compensation coefficient updating circuit performs the weighting processing on the distortion compensation coefficient output from each of the plurality of distortion compensation coefficient storage circuits by multiplying the distortion compensation coefficient by an inhibit coefficient to thereby reduce the distortion compensation coefficient.

13. The distortion compensation device according to claim 12, wherein the inhibit coefficient is less than 1 and not less than 0.

14. The distortion compensation device according to claim 1, wherein the distortion compensation coefficient updating circuit performs the weighting processing on the distortion compensation coefficient output from each of the plurality of distortion compensation coefficient storage circuits by reducing the value of the distortion compensation coefficient to thereby reduce the distortion compensation coefficient.

* * * * *

UNITED STATES PATENT AND TRADEMARK OFFICE
CERTIFICATE OF CORRECTION

PATENT NO. : 8,787,487 B2
APPLICATION NO. : 13/461928
DATED : July 22, 2014
INVENTOR(S) : Kazuo Nagatani et al.

Page 1 of 1

It is certified that error appears in the above-identified patent and that said Letters Patent is hereby corrected as shown below:

In the Claims

Column 26, Line 36, In Claim 5, Delete "weighing" and insert -- weighting --, therefor.

Column 26, Line 52, In Claim 6, Delete "weighing" and insert -- weighting --, therefor.

Column 27, Line 30, In Claim 10, Delete "weighing" and insert -- weighting --, therefor.

Signed and Sealed this
Twenty-eighth Day of October, 2014

Michelle K. Lee
*Deputy Director of the United States Patent and Trademark Office*